(12) United States Patent
Kitagawa

(10) Patent No.: US 9,502,402 B2
(45) Date of Patent: Nov. 22, 2016

(54) SEMICONDUCTOR DEVICE

(71) Applicant: KABUSHIKI KAISHA TOSHIBA, Tokyo (JP)

(72) Inventor: Mitsuhiko Kitagawa, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 297 days.

(21) Appl. No.: 14/047,720

(22) Filed: Oct. 7, 2013

(65) Prior Publication Data

US 2014/0027858 A1 Jan. 30, 2014

Related U.S. Application Data

(62) Division of application No. 12/724,243, filed on Mar. 15, 2010, now Pat. No. 8,581,298.

(30) Foreign Application Priority Data

Mar. 23, 2009 (JP) .................................. 2009-071031

(51) Int. Cl.
*H01L 29/74* (2006.01)
*H01L 27/088* (2006.01)
(Continued)

(52) U.S. Cl.
CPC ......... *H01L 27/088* (2013.01); *H01L 29/0634* (2013.01); *H01L 29/7391* (2013.01); *H01L 29/7394* (2013.01); *H01L 29/7397* (2013.01); *H01L 29/7813* (2013.01); *H01L 29/7824* (2013.01); *H01L 29/7825* (2013.01); *H01L 29/7828* (2013.01); *H01L 29/7831* (2013.01); *H01L 29/7838* (2013.01); *H01L 29/0878* (2013.01); *H01L 29/4236* (2013.01)

(58) Field of Classification Search
CPC ....................... H01L 29/0634; H01L 29/7391
USPC ................................. 257/133–135, 256, 261
See application file for complete search history.

(56) References Cited

U.S. PATENT DOCUMENTS

2008/0197361 A1 8/2008 Ueno

FOREIGN PATENT DOCUMENTS

| JP | 08-088349 A | 4/1996 |
| JP | 2001320049 A | 11/2001 |
| JP | 3281194 B2 | 2/2002 |

OTHER PUBLICATIONS

Japanese Office Action dated Nov. 18, 2014, filed in Japanese counterpart Application No. 2013-236615, 4 pages (with translation).
Japanese Office Action dated Jun. 28, 2013 filed in counterpart Application No. 2011-207204, 5 pages (with translation).
(Continued)

*Primary Examiner* — Samuel Gebremariam
(74) *Attorney, Agent, or Firm* — Patterson & Sheridan, LLP

(57) ABSTRACT

A semiconductor device includes: a semiconductor layer having a first end portion and a second end portion; a first main electrode provided on the first end portion and electrically connected to the semiconductor layer; a second main electrode provided on the second end portion and electrically connected to the semiconductor layer; a first gate electrode provided via a first gate insulating film in a plurality of first trenches formed from the first end portion toward the second end portion; and a second gate electrode provided via a second gate insulating film in a plurality of second trenches formed from the second end portion toward the first end portion. Spacing between a plurality of the first gate electrodes and spacing between a plurality of the second gate electrodes are 200 nm or less.

17 Claims, 16 Drawing Sheets

(51) Int. Cl.
*H01L 29/06* (2006.01)
*H01L 29/739* (2006.01)
*H01L 29/78* (2006.01)
*H01L 29/08* (2006.01)
*H01L 29/423* (2006.01)

(56) References Cited

OTHER PUBLICATIONS

Japanese Office Action dated Oct. 21, 2011 filed in Japanese counterpart Application No. 2009-071031, 14 pages (with translation).

Japanese Office Action dated Jul. 28, 2011 filed in Japanese counterpart Application No. 2009-071031, 12 pages (with translation).

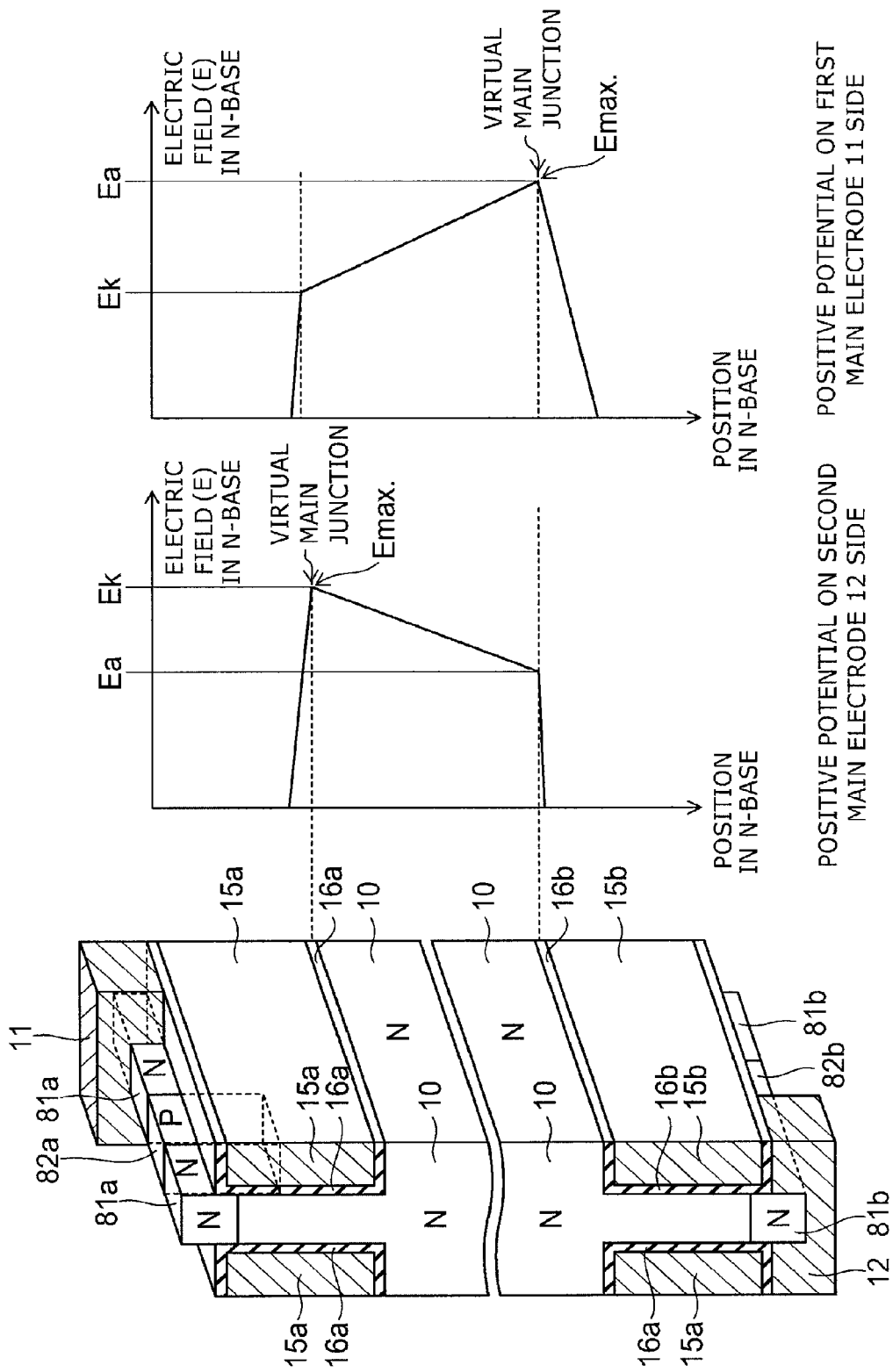

SEMICONDUCTOR DEVICE

CROSS-REFERENCE TO RELATED APPLICATIONS

This application is a division of U.S. patent application Ser. No. 12/724,243, filed on Mar. 15, 2010, which is based upon and claims the benefit of priority from the prior Japanese Patent Application No. 2009-071031, filed on Mar. 23, 2009, the entire contents of which are incorporated herein by reference.

BACKGROUND

Field

Embodiments of this invention relate generally to a semiconductor device suitable for power control, such as an IGBT (insulated gate bipolar transistor), IEGT (injection enhanced gate transistor), MOSFET (metal-oxide-semiconductor field effect transistor), super junction MOSFET.

Background Art

Power semiconductor devices are required to have high breakdown voltage in view of their application. To ensure high breakdown voltage, vertical devices need a thick high-resistance base layer, and lateral devices need a long high-resistance base layer. As the breakdown voltage rating of a device becomes higher, the device needs a thicker or longer high-resistance base layer in proportion to its blocking voltage rating. However, although increase in the thickness or length of the high-resistance base layer can indeed provide a higher breakdown voltage, it results in degradation of on-resistance and switching characteristics. Thus, if the same blocking breakdown voltage can be realized, the structure of a power semiconductor device is desirably such that the high-resistance base layer can be designed to be thinner or shorter.

On the other hand, power semiconductor devices can be classified into the punch-through type and non-punch-through type from the viewpoint of breakdown voltage design. In some applications, power semiconductor devices may need forward and reverse blocking breakdown voltage. However, on a device with the punch-through structure, it is difficult to realize comparable blocking breakdown voltage in the forward and reverse direction. Hence, it is conventionally necessary to use the breakdown voltage design of the non-punch-through type in which the high-resistance base layer is thicker or longer than the width of the depletion layer under application of rated voltage, at the expense of on-resistance and switching characteristics.

As disclosed in Japanese Patent No. 3281194, the present inventor proposed a power semiconductor device having low on-resistance, good switching characteristics, and high forward and reverse breakdown voltage. As a result of subsequent studies, the inventor has found how it is specifically designed to respond to practical requirements.

SUMMARY

According to an aspect of the invention, there is provided a semiconductor device including: a semiconductor layer having a first end portion and a second end portion; a first main electrode provided on the first end portion and electrically connected to the semiconductor layer; a second main electrode provided on the second end portion and electrically connected to the semiconductor layer; a first gate electrode provided via a first gate insulating film in a plurality of first trenches formed from the first end portion toward the second end portion; and a second gate electrode provided via a second gate insulating film in a plurality of second trenches formed from the second end portion toward the first end portion, spacing between a plurality of the first gate electrodes and spacing between a plurality of the second gate electrodes being 200 nm or less.

BRIEF DESCRIPTION OF THE DRAWINGS

FIGS. 16A to 16C are schematic views showing the electric field distribution in the N-type base layer in the semiconductor device shown in FIG. 14.

DETAILED DESCRIPTION

Figure 1:
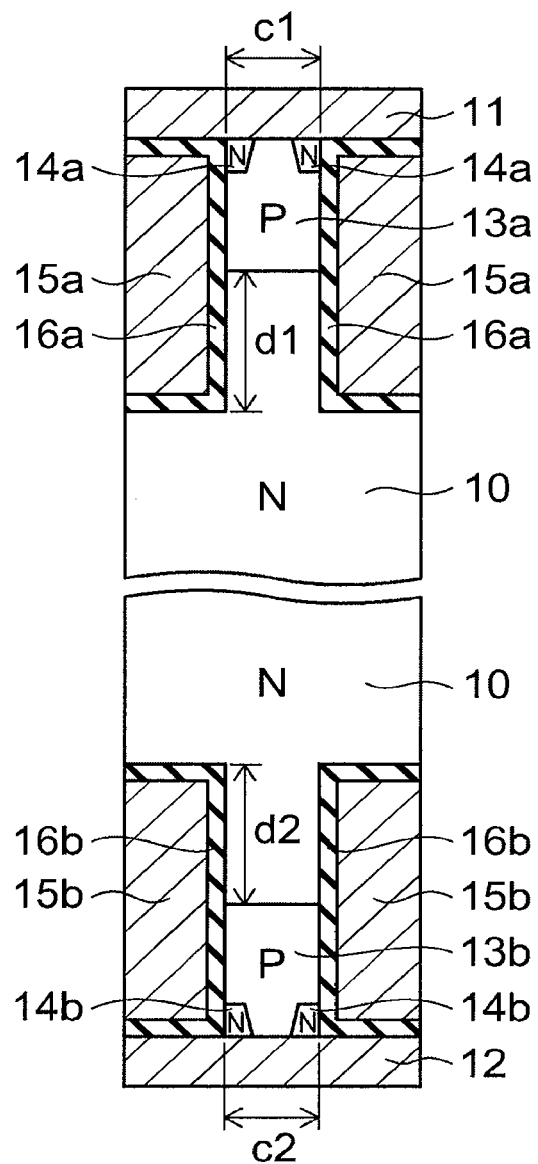
FIG. 1 is a schematic cross-sectional view of a relevant part of a semiconductor device according to a first embodiment of the invention.

Embodiments of the invention will now be described with reference to the drawings. The following embodiments are described assuming that the first conductivity type is N-type and the second conductivity type is P-type. However, the invention is also applicable to the case where the first conductivity type is P-type and the second conductivity type is N-type. Furthermore, although the semiconductor is illustratively silicon, semiconductors other than silicon (such as compound semiconductors including SiC and GaN) can also be used. Substantially identical elements in the drawings are labeled with like reference numerals, and the detailed description of the elements previously described may be omitted.

First Embodiment

FIG. 1 is a schematic cross-sectional view of a relevant part of a semiconductor device according to a first embodiment of the invention.

The semiconductor device according to this embodiment is a vertical device in which a current path is formed in the vertical direction connecting between a first main electrode 11 and a second main electrode 12 provided on the front and rear surface, respectively, of a semiconductor layer. The semiconductor device according to this embodiment includes a cell section in which the current path is formed and a terminal section formed outside the cell section so as to surround the cell section. In FIG. 1, part of the cell section is shown. The structure shown in FIG. 1 is repeated laterally. Also in other embodiments, only the cell section is shown and described.

The semiconductor device according to this embodiment includes an N-type base layer 10, a first P-type base layer 13a provided on the first major surface side of the N-type base layer 10, and a second P-type base layer 13b provided on the second major surface side, opposite to the first major surface, of the N-type base layer 10.

An N-type first source layer 14a is selectively formed in the surface of the first P-type base layer 13a, and an N-type second source layer 14b is selectively formed in the surface of the second P-type base layer 13b. The N-type impurity concentration in these source layers 14a, 14b is higher than that in the N-type base layer 10.

A plurality of first trenches are formed from the surface of the first P-type base layer 13a to the N-type base layer 10, and a first gate electrode 15a is buried in the first trench via a first gate insulating film 16a. The first gate electrodes 15a are formed in a stripe planar pattern extending in a direction penetrating through the page.

A plurality of second trenches are formed from the surface of the second P-type base layer 13b to the N-type base layer 10, and a second gate electrode 15b is buried in the second trench via a second gate insulating film 16b. The second gate electrodes 15b are formed in a stripe planar pattern extending in a direction penetrating through the page.

The first main electrode 11 is provided on the surface of the first P-type base layer 13a and the first source layer 14a. Thus, the first P-type base layer 13a and the first source layer 14a are electrically connected to the first main electrode 11. The second main electrode 12 is provided on the surface of the second P-type base layer 13b and the second source layer 14b. Thus, the second P-type base layer 13b and the second source layer 14b are electrically connected to the second main electrode 12.

Here, the state in which the second main electrode 12 is placed at a higher potential than the first main electrode 11 is defined as the state in which a forward voltage is applied between the first main electrode 11 and the second main electrode 12. Conversely, the state in which the first main electrode 11 is placed at a higher potential than the second main electrode 12 is defined as the state in which a reverse voltage is applied between the first main electrode 11 and the second main electrode 12.

The first gate electrode 15a and the second gate electrode 15b are each connected to a gate control circuit, not shown.

If a forward voltage is applied between the first main electrode 11 and the second main electrode 12, and a positive potential is applied to the first gate electrode 15a with the first main electrode 11 placed at 0 V or a negative potential, then an N-type channel is formed in the first P-type base layer 13a opposed to the first gate electrode 15a across the first gate insulating film 16a, and electrons are injected from the first source layer 14a into the N-type base layer 10. If a negative potential is applied to the second gate electrode 15b with the second main electrode 12 placed at a positive potential, then holes are injected from the second P-type base layer 13b into the N-type base layer 10. That is, in this case, bipolar operation occurs in the device, which is turned on with a current flowing between the first main electrode 11 and the second main electrode 12.

In the above state of forward voltage application, if a positive potential is applied to the second gate electrode 15b, then an N-type channel is formed in the second P-type base layer 13b opposed to the second gate electrode 15b across the second gate insulating film 16b. That is, an N-type channel is formed in both the first P-type base layer 13a and the second P-type base layer 13b, causing unipolar operation.

Conversely, if a reverse voltage is applied between the first main electrode 11 and the second main electrode 12, and a positive potential is applied to the second gate electrode 15b with the second main electrode 12 placed at 0 V or a negative potential, then an N-type channel is formed in the second P-type base layer 13b opposed to the second gate electrode 15b across the second gate insulating film 16b, and electrons are injected from the second source layer 14b into the N-type base layer 10. If a negative potential is applied to the first gate electrode 15a with the first main electrode 11 placed at a positive potential, then holes are injected from the first P-type base layer 13a into the N-type base layer 10. That is, in this case, bipolar operation occurs in the device, which is turned on with a current flowing between the first main electrode 11 and the second main electrode 12.

In the above state of reverse voltage application, if a positive potential is applied to the first gate electrode 15a, then an N-type channel is formed in the first P-type base layer 13a opposed to the first gate electrode 15a across the first gate insulating film 16a. That is, an N-type channel is formed in both the first P-type base layer 13a and the second P-type base layer 13b, causing unipolar operation.

Next, the function of retaining breakdown voltage in the semiconductor device according to this embodiment is described. By a suitable design of the trench gate structure section as described later, the semiconductor device according to this embodiment can achieve high breakdown voltage in both the forward and reverse direction with the gate electrodes 15a, 15b short-circuited to the first main electrode 11 and the second main electrode 12, respectively, even without control over the potential of the gate electrodes 15a, 15b by the gate control circuit, or even in such a situation where the supply of control voltage from the gate control circuit is shut off.

Figure 2:
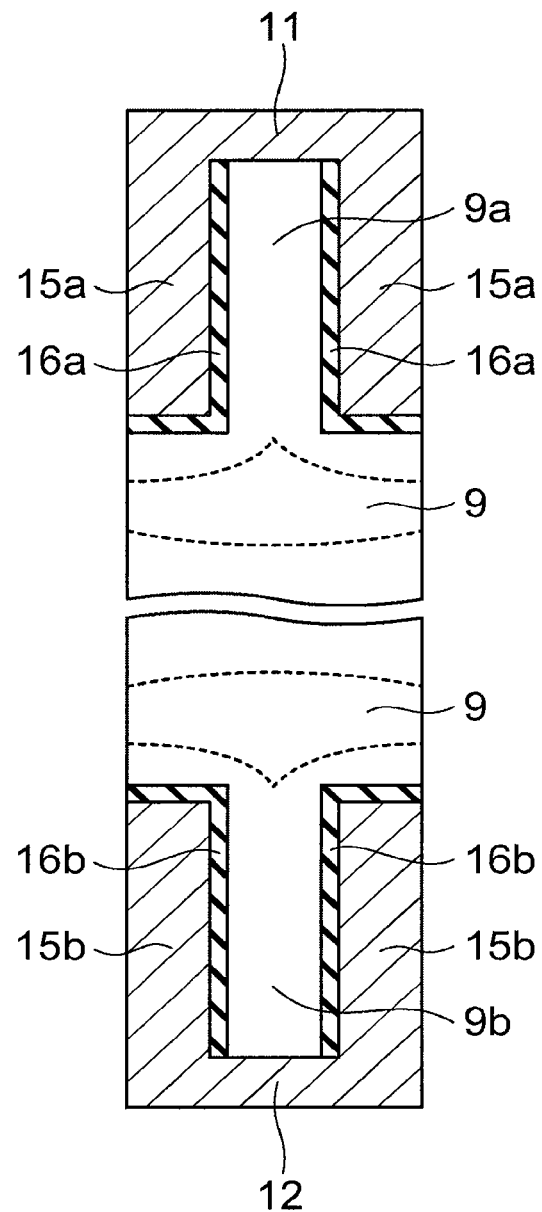
FIG. 2 is a schematic view describing the function of retaining breakdown voltage of the semiconductor device according to the first embodiment.

FIG. 2 schematically illustrates the function of retaining breakdown voltage in the semiconductor device according to this embodiment. Although this FIG. 2 corresponds to FIG. 1, the semiconductor portion is collectively shown as a semiconductor layer 9 of a certain conductivity type (such as N-type), because how the depletion layer extends in the structure of this embodiment is determined not by the PN junction but by the design of the trench gate structure section.

If a forward voltage is applied between the first main electrode 11 and the second main electrode 12 with the first main electrode 11 short-circuited to the first gate electrode 15a and the second main electrode 12 short-circuited to the second gate electrode 15b, then as schematically shown by dotted lines in FIG. 2, the depletion layer extends from the first gate electrode 15a side toward the second gate electrode 15b side.

First, in the portion 9a of the semiconductor layer 9 sandwiched between the first gate electrodes 15a, the depletion layers extending from the interface with the first gate insulating films 16a on both sides are pinched off, because of the narrow width, or high aspect ratio (ratio of thickness to width), of the portion 9a.

Then, the depletion layer pinched off between the first gate electrodes 15a extends in the semiconductor layer 9 toward the second gate electrode 15b. Here, because of the narrow spacing between the second gate electrodes 15b, or high aspect ratio (ratio of thickness to width) of the portion 9b of the semiconductor layer 9 sandwiched between the second gate electrodes 15b, the depletion layer is pinched off and stops extension in the portion 9b between the second gate electrodes 15b, not reaching the second main electrode 12.

Furthermore, the second gate electrode 15b is short-circuited to the second main electrode 12 and placed at the potential of the second main electrode 12 (negative potential in the forward biased case) or a potential close thereto, and carriers (electrons, in this case) are excited in the portion of the semiconductor layer 9 opposed to the second gate electrode 15b across the second gate insulating film 16b. Because of the narrow spacing between the second gate electrodes 15b, or high aspect ratio of the portion 9b of the semiconductor layer 9 sandwiched between the second gate electrodes 15b, electrons are accumulated near the end portion of the second gate electrodes 15b and the portion 9b on the first gate electrode 15a side, functioning as an $N^+$-type stopper layer. This also suppresses the depletion layer from extending toward the second main electrode 12.

That is, because of the aforementioned structure of the first gate electrode 15a and the second gate electrode 15b, when a forward voltage is applied to the structure of FIG. 1, the depletion layer is pinched off between the first gate electrodes 15a in the N-type base layer 10, and stops by pinch-off between the second gate electrodes 15b, not reaching the second P-type base layer 13b. Thus, a high forward breakdown voltage can be achieved. This is realized not by thickening the N-type base layer 10, but by the design of the trench gate structure section on the front and rear side. Hence, the N-type base layer 10 can be thinned. Consequently, it is possible to reduce on-resistance and improve switching characteristics while ensuring high breakdown voltage.

Next, if a reverse voltage is applied between the first main electrode 11 and the second main electrode 12 with the first main electrode 11 short-circuited to the first gate electrode 15a and the second main electrode 12 short-circuited to the second gate electrode 15b, then contrary to the above case of forward voltage application, the depletion layer extends from the second gate electrode 15b side toward the first gate electrode 15a side.

That is, in FIG. 2, in the portion 9b of the semiconductor layer 9 sandwiched between the second gate electrodes 15b, the depletion layers extending from the interface with the second gate insulating films 16b on both sides are pinched off, because of the narrow width, or high aspect ratio, of the portion 9b.

Then, the depletion layer pinched off between the second gate electrodes 15b extends in the semiconductor layer 9 toward the first gate electrode 15a. Here, because of the narrow spacing between the first gate electrodes 15a, or high aspect ratio of the portion 9a of the semiconductor layer 9 sandwiched between the first gate electrodes 15a, the depletion layer is pinched off and stops extension in the portion 9a between the first gate electrodes 15a, not reaching the first main electrode 11.

Furthermore, the first gate electrode 15a is short-circuited to the first main electrode 11 and placed at the potential of the first main electrode 11 (negative potential in the reverse biased case) or a potential close thereto, and carriers (electrons, in this case) are excited in the portion of the semiconductor layer 9 opposed to the first gate electrode 15a across the first gate insulating film 16a. Because of the narrow spacing between the first gate electrodes 15a, or high aspect ratio of the portion 9a of the semiconductor layer 9 sandwiched between the first gate electrodes 15a, electrons are accumulated near the end portion of the first gate electrodes 15a and the portion 9a on the second gate electrode 15b side, functioning as an $N^+$-type stopper layer. This also suppresses the depletion layer from extending toward the first main electrode 11.

That is, because of the aforementioned structure of the first gate electrode 15a and the second gate electrode 15b, when a reverse voltage is applied to the structure of FIG. 1, the depletion layer is pinched off between the second gate electrodes 15b in the N-type base layer 10, and stops by pinch-off between the first gate electrodes 15a, not reaching the first P-type base layer 13a. Thus, a high reverse breakdown voltage can be achieved. This is also realized not by thickening the N-type base layer 10, but by the design of the trench gate structure section on the front and rear side. Hence, the N-type base layer 10 can be thinned. Consequently, also during application of reverse voltage, it is possible to reduce on-resistance and improve switching characteristics while ensuring high breakdown voltage.

Here, the inventor has found that the above function of retaining breakdown voltage can be reliably achieved if the spacing c1 between the first gate electrodes 15a and the spacing c2 between the second gate electrodes 15b are each 200 nm or less, or $c1/d1<0.2$, where d1 is the thickness of the portion of the N-type base layer 10 sandwiched between the first gate electrodes 15a, and $c2/d2<0.2$, where d2 is the thickness of the portion of the N-type base layer 10 sandwiched between the second gate electrodes 15b.

Figure 3:
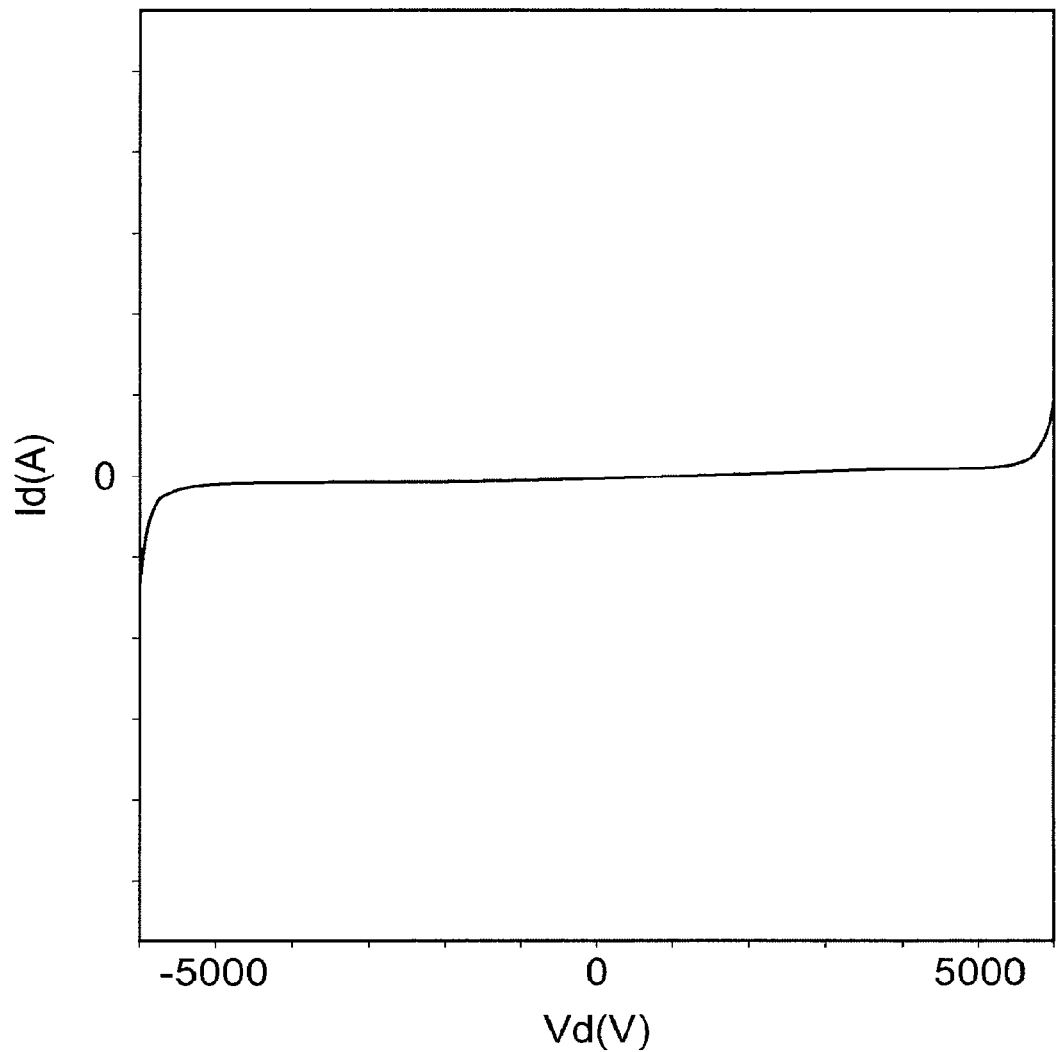
FIG. 3 shows a simulation result for the relationship of the voltage-current characteristics of the semiconductor device according to this embodiment.

FIG. 3 shows a simulation result for the relationship of the voltage Vd (V) between the first main electrode 11 and the second main electrode 12 versus the current Id (A) flowing between the first main electrode 11 and the second main electrode 12 in the semiconductor device according to this embodiment.

The model shown in FIG. 1 was used under the following conditions.

The spacing c1 between the first gate electrodes 15a is c1=200 nm, the spacing c2 between the second gate electrodes 15b is c2=200 nm, the thickness d1 of the portion of the N-type base layer 10 sandwiched between the first gate electrodes 15a is d1=3 μm, the thickness d2 of the portion of the N-type base layer 10 sandwiched between the second gate electrodes 15b is d2=3 μm, the thickness of the first gate electrode 15a (or the depth of the first trench filled therewith) is 5 μm, the thickness of the second gate electrode 15b (or the depth of the second trench filled therewith) is 5 μm, and the thickness of the portion of the N-type base layer 10 between the first gate electrode 15a and the second gate electrode 15b is 450 μm.

The result obtained by this simulation is that, as shown in FIG. 3, a breakdown voltage of 6010 V can be achieved in both the forward and reverse direction.

As described above, because of the trench gate structure, this embodiment can prevent the depletion layer extending from one of the P-type base layers 13a, 13b from reaching the other P-type base layer to achieve high breakdown voltage even if the N-type base layer 10 is thinned. Because the N-type base layer 10 can be thinned, it is possible to reduce on-resistance and improve switching characteristics. Furthermore, because of the symmetric device structure between the device front side, or the first main electrode 11 side, and the opposite (rear) side, or the second main electrode 12 side, an equal breakdown voltage can be ensured in the case of applying maximum forward voltage and in the case of applying maximum reverse voltage. That is, this embodiment can provide a semiconductor device capable of ensuring high breakdown voltage in both the forward and reverse direction without increasing on-resistance and degrading switching characteristics.

Furthermore, by the suitable design of the trench gate structure as described above, high breakdown voltage can be achieved in both the forward and reverse direction with the first main electrode 11 short-circuited to the first gate electrode 15a and the second main electrode 12 short-circuited to the second gate electrode 15b. That is, high breakdown voltage can be ensured in both the forward and reverse direction even without control over the first gate electrode 15a and the second gate electrode 15b by the gate control circuit. Hence, this embodiment can provide a semiconductor device convenient for practical use, which can ensure high breakdown voltage in both the forward and reverse direction even in a situation where no control voltage is supplied from the gate control circuit to the first gate electrode 15a and the second gate electrode 15b, such as during circuit start-up and during the downtime of the gate control circuit due to power outage or failure.

Second Embodiment

Figure 4:
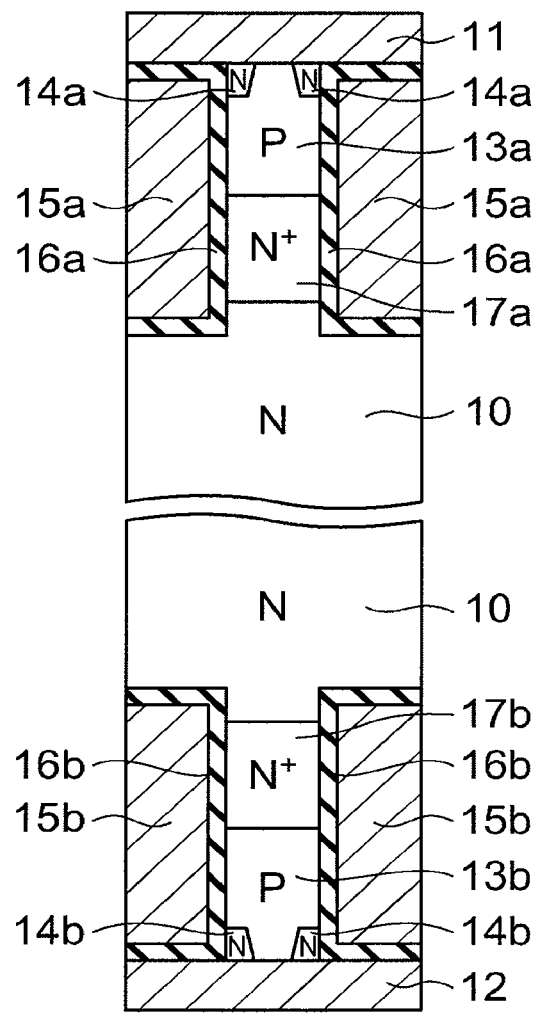
FIG. 4 is a schematic cross-sectional view of a relevant part of a semiconductor device according to a second embodiment of the invention.

FIG. 4 is a schematic cross-sectional view of a relevant part of a semiconductor device according to a second embodiment of the invention.

In this embodiment, in addition to the configuration of the above first embodiment, an N$^+$-type first stopper layer 17a having a higher N-type impurity concentration than the N-type base layer 10 is provided in the portion of the N-type base layer 10 in contact with the first P-type base layer 13a, and an N$^+$-type second stopper layer 17b having a higher N-type impurity concentration than the N-type base layer 10 is provided in the portion of the N-type base layer 10 in contact with the second P-type base layer 13b.

The second stopper layer 17b can suppress the depletion layer from extending to the second P-type base layer 13b during application of forward voltage, and the first stopper layer 17a can suppress the depletion layer from extending to the first P-type base layer 13a during application of reverse voltage. Thus, the effect of enhancing breakdown voltage can be further improved in both the forward and reverse direction.

Here, it is also possible to provide only the second stopper layer 17b, in which case the breakdown voltage during application of forward voltage can be further increased. Alternatively, it is also possible to provide only the first stopper layer 17a, in which case the breakdown voltage during application of reverse voltage can be further increased.

Third Embodiment

Figure 5:
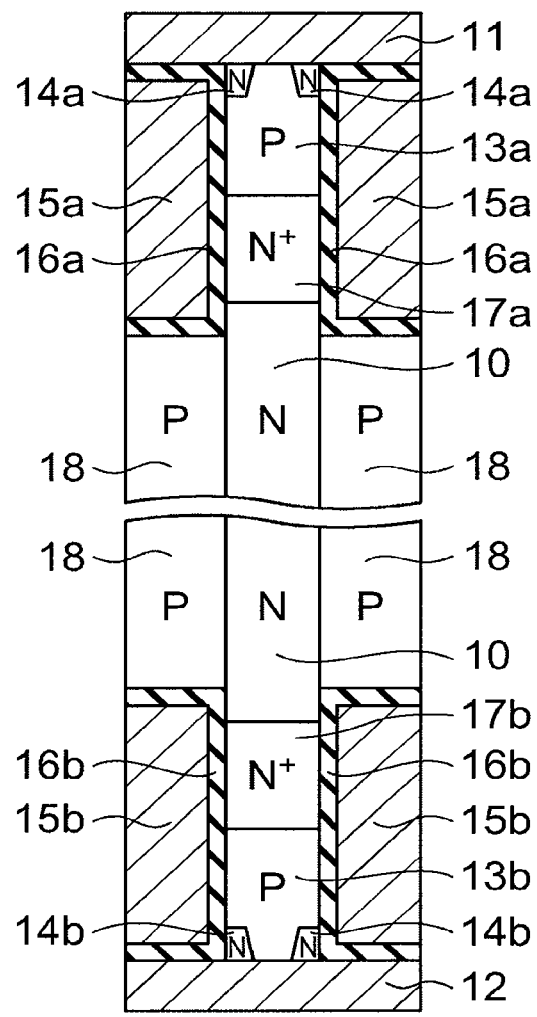
FIG. 5 is a schematic cross-sectional view of a relevant part of a semiconductor device according to a third embodiment of the invention.

FIG. 5 is a schematic cross-sectional view of a relevant part of a semiconductor device according to a third embodiment of the invention.

In this embodiment, in addition to the configuration of the above second embodiment, a third P-type base layer 18 is provided adjacent to the N-type base layer 10. The third P-type base layer 18 is adjacent in the lateral direction, which is generally parallel to the first major surface and the second major surface of the N-type base layer 10. The N-type base layer 10 is provided in the portion vertically connecting between the first P-type base layer 13a and the second P-type base layer 13b, and the third P-type base layer 18 is provided in the portion vertically connecting between the first gate electrode 15a and the second gate electrode 15b.

The N-type base layers 10 and the third P-type base layers 18 are adjacent (form a pn junction) alternately in the lateral direction and periodically arranged to constitute a so-called "super junction structure". In this super junction structure, a non-doped layer is artificially produced by equalizing the amount of charge (amount of impurity) contained in the N-type base layer 10 with that contained in the third P-type base layer 18 so that a higher breakdown voltage can be retained. That is, during application of forward voltage or reverse voltage, a higher breakdown voltage can be retained by the depletion layer extending laterally from the PN junction between the N-type base layer 10 and the third P-type base layer 18. Furthermore, while retaining high breakdown voltage, a current is passed through the N-type base layer 10 which is relatively highly doped. Thus, low on-resistance beyond the material limit can be realized.

Figure 13:
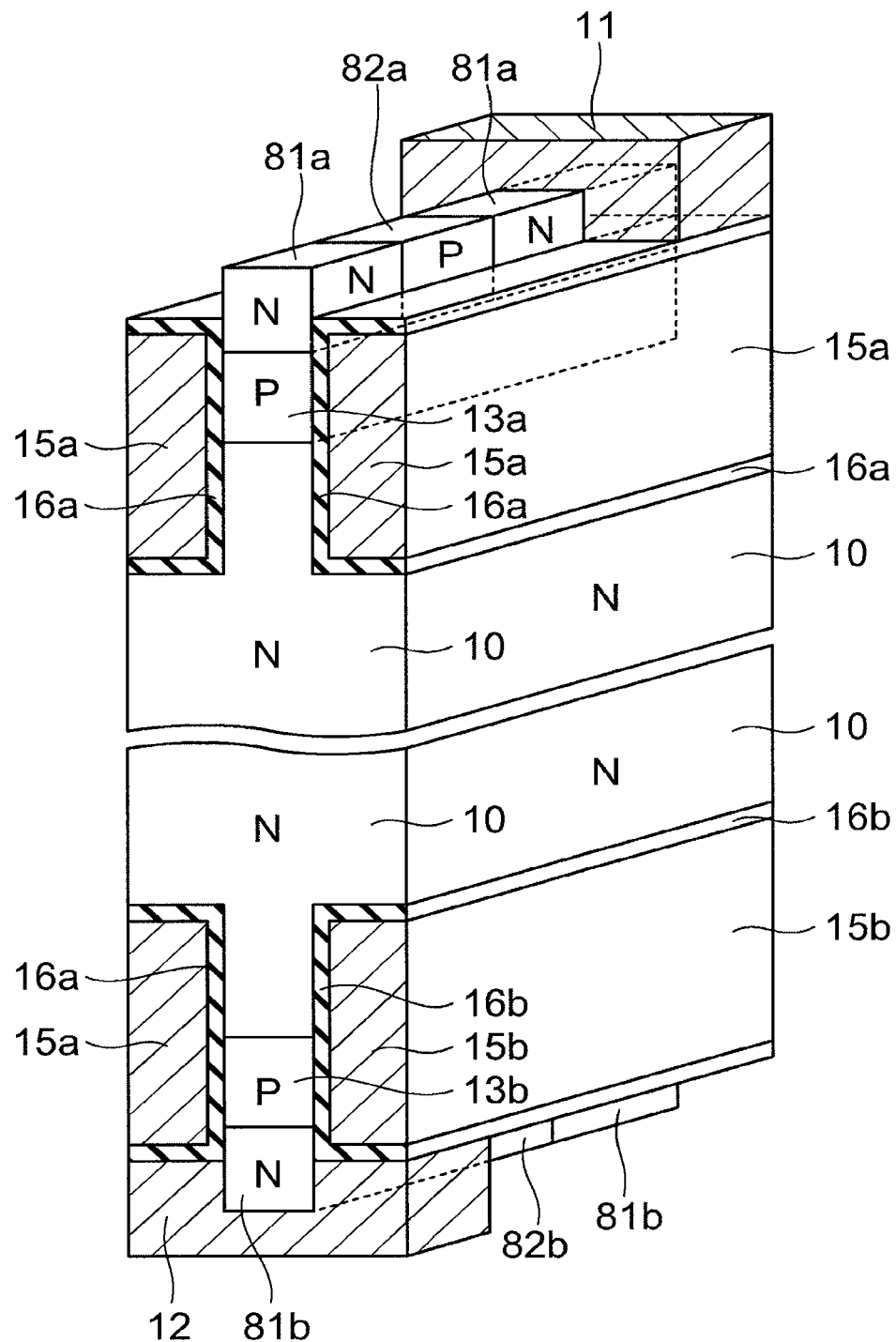
FIG. 13 is a schematic view showing a variation of the semiconductor device according to the first embodiment.

FIG. 13 shows a variation of the first embodiment. In the structure of FIG. 13, a first P-type base layer 13a is provided above the portion of the N-type base layer 10 sandwiched between the first gate electrodes 15a.

The first P-type base layer 13a extends in the extending direction of the first gate electrode 15a. An N-type first source layer 81a and a first P-type layer 82a are provided above the first P-type base layer 13a. The first source layer 81a is an element corresponding to the first source layer 14a in FIG. 1. The first P-type layer 82a can be regarded as part of the first P-type base layer 13a. The first source layer 81a and the first P-type layer 82a are provided alternately and adjacently in the extending direction of the first gate electrode 15a.

A first main electrode 11 is provided above the first gate electrode 15a via a first gate insulating film 16a. The first source layer 81a and the first P-type layer 82a protrude upward from the first gate electrode 15a, and the upper surface and side surface of the protruding portion are covered with the first main electrode 11 in contact therewith.

More specifically, at its upper surface and side surface, the first source layer 81a is in contact with the first main electrode 11 and electrically connected to the first main electrode 11. At its upper surface and side surface, the first P-type layer 82a is in contact with the first main electrode 11. Through this first P-type layer 82a, the first P-type base layer 13a is electrically connected to the first main electrode 11. Hence, as compared with the structure in which the first source layer and the first P-type base layer are in contact with the first main electrode only at their upper surface, the contact resistance of the first main electrode to the first source layer and the first P-type base layer can be reduced.

Likewise, a second P-type base layer 13b is provided below the portion of the N-type base layer 10 sandwiched between the second gate electrodes 15b.

The second P-type base layer 13b extends in the extending direction of the second gate electrode 15b. An N-type second source layer 81b and a second P-type layer 82b are provided below the second P-type base layer 13b. The second source layer 81b is an element corresponding to the second source layer 14b in FIG. 1. The second P-type layer 82b can be regarded as part of the second P-type base layer 13b. The second source layer 81b and the second P-type layer 82b are provided alternately and adjacently in the extending direction of the second gate electrode 15b.

A second main electrode 12 is provided below the second gate electrode 15b via a second gate insulating film 16b. The second source layer 81b and the second P-type layer 82b protrude downward from the second gate electrode 15b, and the lower surface and side surface of the protruding portion are covered with the second main electrode 12 in contact therewith.

More specifically, at its lower surface and side surface, the second source layer 81b is in contact with the second main electrode 12 and electrically connected to the second main electrode 12. At its lower surface and side surface, the second P-type layer 82b is in contact with the second main electrode 12. Through this second P-type layer 82b, the second P-type base layer 13b is electrically connected to the second main electrode 12. Hence, the contact resistance can be reduced also on the second main electrode 12 side.

Figure 14:
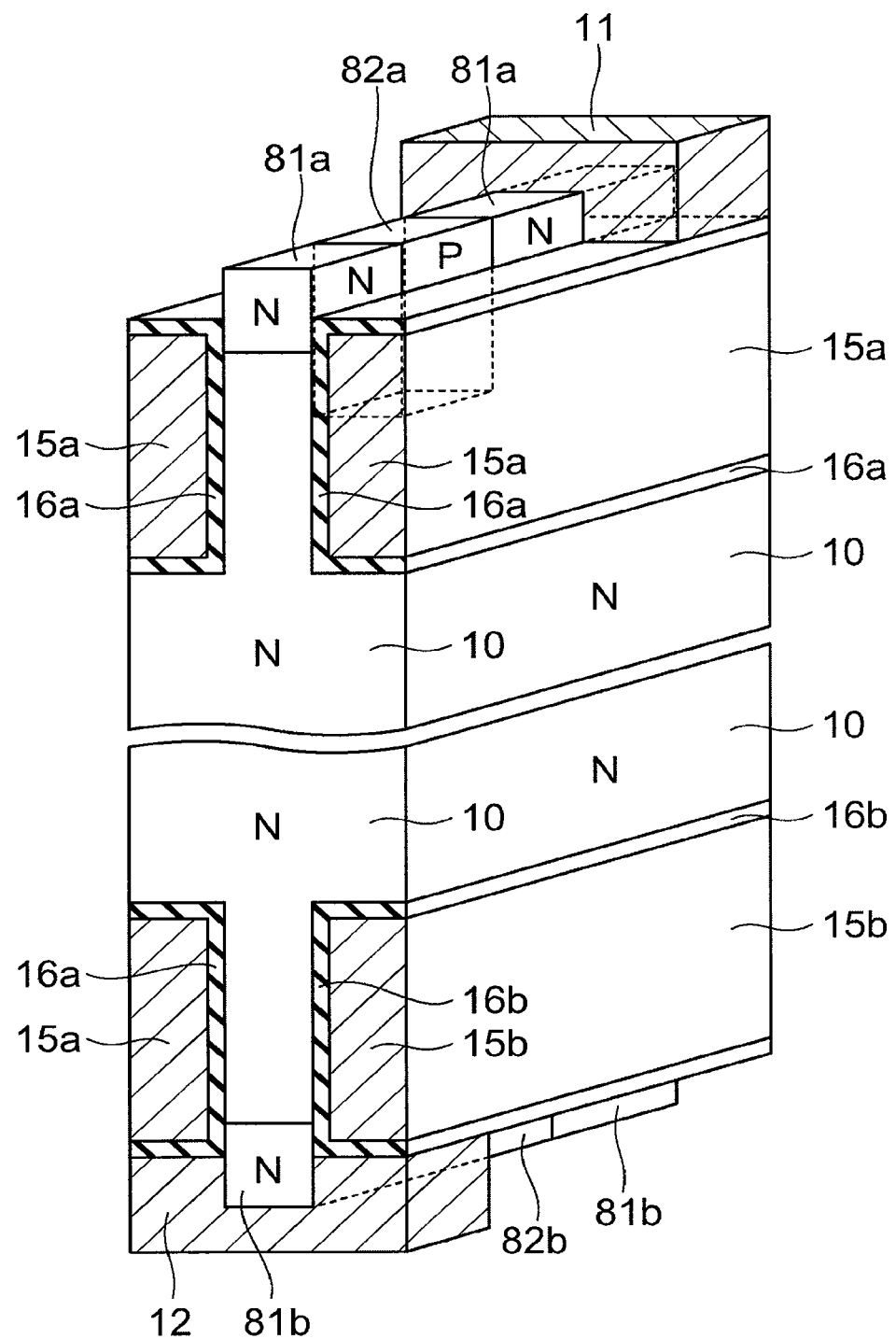
FIG. 14 is a schematic view showing another variation of the semiconductor device according to the first embodiment.

Here, without providing the first P-type base layer 13a extending in the extending direction of the first gate electrode 15a, it is also possible to use a structure as shown in FIG. 14 in which the first P-type layer 82a is in contact with the N-type base layer 10 between the first gate electrodes 15a. Likewise, the second P-type layer 82b is in contact with the N-type base layer 10 between the second gate electrodes 15b.

Figure 15:
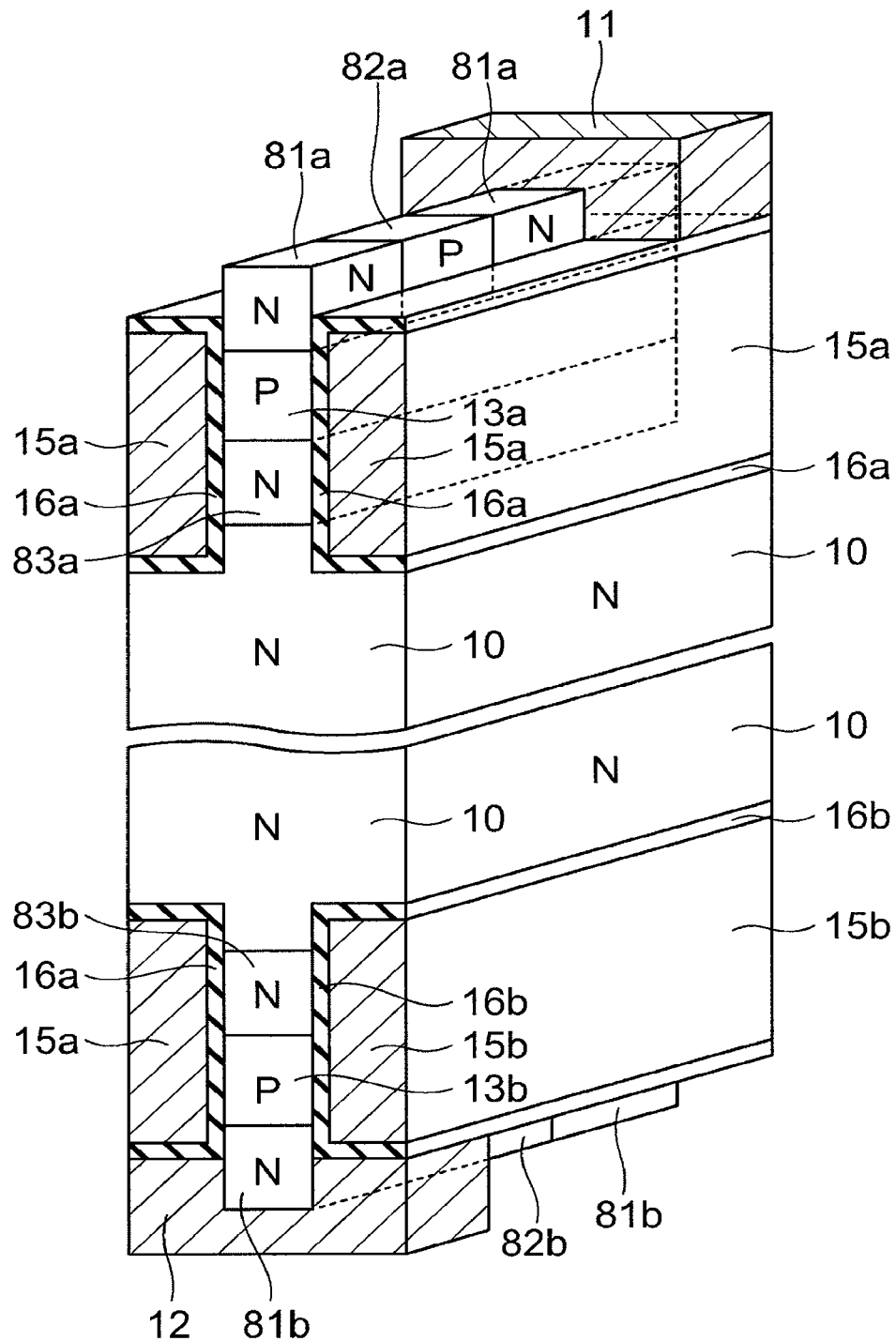
FIG. 15 is a schematic view showing still another variation of the semiconductor device according to the first embodiment.

Alternatively, as shown in FIG. 15, a first N-type layer 83a may be provided between the first P-type base layer 13a and the N-type base layer 10. The first N-type layer 83a extends between the first gate electrodes 15a in the extending direction of the first gate electrode 15a, and the first P-type base layer 13a is provided above this first N-type layer 83a.

Likewise, a second N-type layer 83b may be provided between the N-type base layer 10 and the second P-type base layer 13b. The second N-type layer 83b extends between the second gate electrodes 15b in the extending direction of the second gate electrode 15b, and the second P-type base layer 13b is provided below this second N-type layer 83b.

Next, the electric field distribution in the N-type base layer 10 in the above embodiments is described with reference to FIG. 16.

FIG. 16A illustratively shows a semiconductor device having the structure shown in FIG. 14. However, this may be the structure shown in one of FIGS. 1, 4, 13, and 15.

FIG. 16B shows the electric field distribution in the N-type base layer 10 in the state in which the second main electrode 12 is placed at a higher potential (positive potential) relative to the first main electrode 11. FIG. 16C shows the electric field distribution in the N-type base layer 10 in the state in which the first main electrode 11 is placed at a higher potential (positive potential) relative to the second main electrode 12.

In FIGS. 16B and 16C, the vertical axis represents position in the N-type base layer 10 along the depth, and the horizontal axis represents electric field in the N-type base layer 10. Ek denotes electric field at the boundary between the first trench or the first gate insulating film 16a and the N-type base layer 10, and Ea denotes electric field at the boundary between the second trench or the second gate insulating film 16b and the N-type base layer 10.

In the case of FIG. 16B where the second main electrode 12 side is placed at a positive potential, the peak (maximum Emax) of electric field lies at the boundary between the first trench or the first gate insulating film 16a and the N-type base layer 10. In the case of FIG. 16C where the first main electrode 11 side is placed at a positive potential, the peak (maximum Emax) of electric field lies at the boundary between the second trench or the second gate insulating film 16b and the N-type base layer 10.

In this embodiment, high breakdown voltage can be achieved in both the forward and reverse direction by designing the trench gate structure section so that the absolute value of (Ea−Ek)/Emax is smaller than 0.7, or smaller than 0.5.

Fourth Embodiment

FIG. 6 is a schematic cross-sectional view of a relevant part of a semiconductor device according to a fourth embodiment of the invention.

The semiconductor device according to this embodiment is a lateral device having an SOI (silicon on insulator) structure in which a current path is formed in the lateral direction connecting between a first main electrode 21 and a second main electrode 22 spaced from each other on an insulating layer 32 provided on a semiconductor substrate (or semiconductor layer) 31.

Figure 6A:
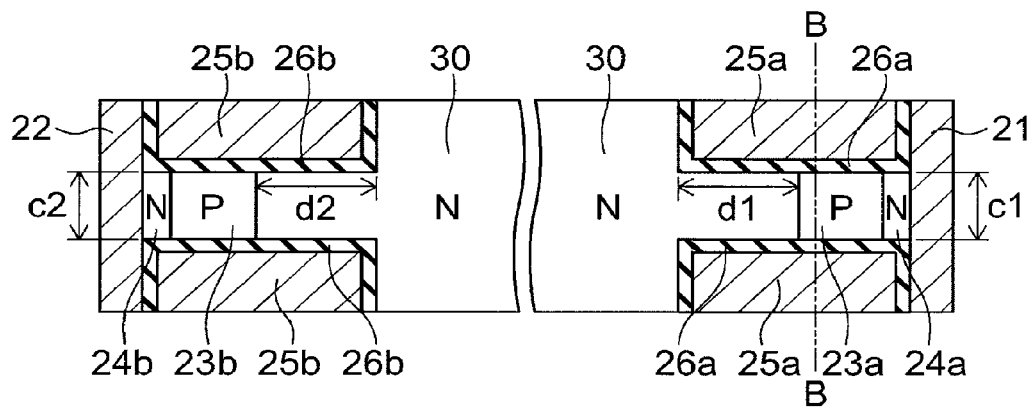
FIGS. 6A to 6C are schematic cross-sectional views of a relevant part of a semiconductor device according to a fourth embodiment of the invention.
Figure 6B:
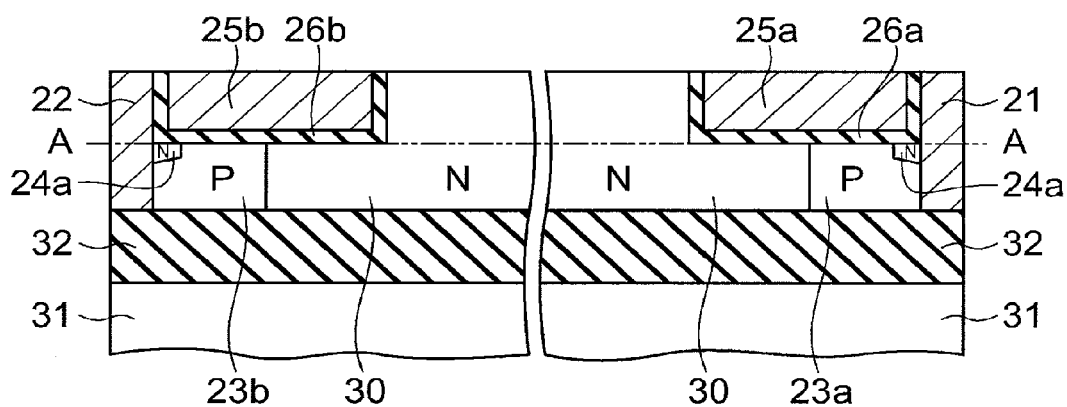
Figure 6C:
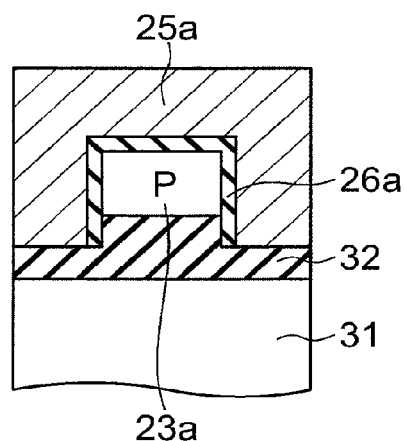

FIG. 6B shows a cross section in the direction connecting between the first main electrode 21 and the second main electrode 22, FIG. 6A shows the A-A cross section in FIG. 6B, and FIG. 6C shows the B-B cross section in FIG. 6A.

An N-type base layer 30, a first P-type base layer 23a, and a second P-type base layer 23b are provided on the insulating layer 32. The first P-type base layer 23a and the second P-type base layer 23b are provided so that the N-type base layer 30 is laterally sandwiched therebetween.

An N-type first source layer 24a is selectively formed in the end surface of the first P-type base layer 23a, and an N-type second source layer 24b is selectively formed in the end surface of the second P-type base layer 23b. The N-type impurity concentration in these source layers 24a, 24b is higher than that in the N-type base layer 30.

As shown in FIG. 6A, a plurality of first trenches reaching the insulating layer 32 are formed in the first P-type base layer 23a and one end portion of the N-type base layer 30 in contact therewith, and a first gate electrode 25a is buried in the first trench via a first gate insulating film 26a. A plurality of second trenches reaching the insulating layer 32 are formed in the second P-type base layer 23b and the other end portion of the N-type base layer 30 in contact therewith, and a second gate electrode 25b is buried in the second trench via a second gate insulating film 26b.

As shown in FIGS. 6B and 6C, the first gate electrodes 25a buried in the respective trenches are connected on the surface of the first P-type base layer 23a. That is, the first gate electrode 25a is provided also on the surface of the first P-type base layer 23a and one end portion of the N-type base layer 30 via the first gate insulating film 26a.

Likewise, the second gate electrodes 25b buried in the respective trenches are connected on the surface of the second P-type base layer 23b. That is, the second gate electrode 25b is provided also on the surface of the second P-type base layer 23b and the other end portion of the N-type base layer 30 via the second gate insulating film 26b.

The first main electrode 21 is provided on the insulating layer 32 so as to be in contact with the first P-type base layer 23a and the first source layer 24a. Thus, the first P-type base layer 23a and the first source layer 24a are electrically connected to the first main electrode 21. The second main electrode 22 is provided on the insulating layer 32 so as to be in contact with the second P-type base layer 23b and the second source layer 24b. Thus, the second P-type base layer 23b and the second source layer 24b are electrically connected to the second main electrode 22.

Here, the state in which the second main electrode 22 is placed at a higher potential than the first main electrode 21 is defined as the state in which a forward voltage is applied between the first main electrode 21 and the second main electrode 22. Conversely, the state in which the first main electrode 21 is placed at a higher potential than the second main electrode 22 is defined as the state in which a reverse voltage is applied between the first main electrode 21 and the second main electrode 22.

The first gate electrode 25a and the second gate electrode 25b are each connected to a gate control circuit, not shown.

Also in this embodiment, an operation similar to that of the aforementioned vertical semiconductor device is realized with the only difference in that the current path is vertical or lateral.

If a forward voltage is applied between the first main electrode 21 and the second main electrode 22, and a positive potential is applied to the first gate electrode 25a with the first main electrode 21 placed at 0 V or a negative potential, then an N-type channel is formed in the first P-type base layer 23a opposed to the first gate electrode 25a across the first gate insulating film 26a, and electrons are injected from the first source layer 24a into the N-type base layer 30. If a negative potential is applied to the second gate electrode 25b with the second main electrode 22 placed at a positive potential, then holes are injected from the second P-type base layer 23b into the N-type base layer 30. That is, in this case, bipolar operation occurs in the device, which is turned on with a current flowing between the first main electrode 21 and the second main electrode 22.

In the above state of forward voltage application, if a positive potential is applied to the second gate electrode 25b, then an N-type channel is formed in the second P-type base layer 23b opposed to the second gate electrode 25b across the second gate insulating film 26b. That is, an N-type channel is formed in both the first P-type base layer 23a and the second P-type base layer 23b, causing unipolar operation.

If a reverse voltage is applied between the first main electrode 21 and the second main electrode 22, and a positive potential is applied to the second gate electrode 25b with the second main electrode 22 placed at 0 V or a negative potential, then an N-type channel is formed in the second P-type base layer 23b opposed to the second gate electrode 25b across the second gate insulating film 26b, and electrons are injected from the second source layer 24b into the N-type base layer 30. If a negative potential is applied to the first gate electrode 25a with the first main electrode 21 placed at a positive potential, then holes are injected from the first P-type base layer 23a into the N-type base layer 30. That is, in this case, bipolar operation occurs in the device, which is turned on with a current flowing between the first main electrode 21 and the second main electrode 22.

In the above state of reverse voltage application, if a positive potential is applied to the first gate electrode 25a, then an N-type channel is formed in the first P-type base layer 23a opposed to the first gate electrode 25a across the first gate insulating film 26a. That is, an N-type channel is formed in both the first P-type base layer 23a and the second P-type base layer 23b, causing unipolar operation.

Furthermore, as shown in FIG. 6C, the trench and the first gate electrode 25a buried therein are formed so as to penetrate into the insulating layer 32 more deeply than the interface between the insulating layer 32 and the SOI layer in which the first P-type base layer 23a and the N-type base layer 30 are formed. Likewise, the trench and the second gate electrode 25b buried therein are also formed so as to penetrate into the insulating layer 32 more deeply than the interface between the insulating layer 32 and the SOI layer in which the second P-type base layer 23b and the N-type base layer 30 are formed. This structure allows the potential of the first gate electrode 25a and the second gate electrode 25b to be readily applied to the rear side of the SOI layer as well, and can reduce the effect of the substrate potential on the SOI layer.

Also in this embodiment, as in the aforementioned embodiments, by a suitable design of the trench gate structure section, the semiconductor device can achieve high breakdown voltage in both the forward and reverse direction with the gate electrodes 25a, 25b short-circuited to the first main electrode 21 and the second main electrode 22, respectively.

More specifically, if a forward voltage is applied between the first main electrode 21 and the second main electrode 22 with the first main electrode 21 short-circuited to the first gate electrode 25a and the second main electrode 22 short-circuited to the second gate electrode 25b, then, first, in the portion of the N-type base layer 30 sandwiched between the first gate electrodes 25a, the depletion layers extending from the interface with the first gate insulating films 26a on both sides are pinched off, because of the narrow width, or high length-to-width ratio, of that portion.

Then, the depletion layer pinched off between the first gate electrodes 25a extends in the N-type base layer 30 toward the second gate electrode 25b. Here, because of the narrow spacing between the second gate electrodes 25b, or high length-to-width ratio of the portion of the N-type base layer 30 sandwiched between the second gate electrodes 25b, the depletion layer is pinched off and stops extension between the second gate electrodes 25b, not reaching the second P-type base layer 23b.

Furthermore, the second gate electrode 25b is short-circuited to the second main electrode 22 and placed at the potential of the second main electrode 22 (negative potential in the forward biased case) or a potential close thereto, and carriers (electrons, in this case) are excited in the portion of the N-type base layer 30 opposed to the second gate electrode 25b across the second gate insulating film 26b. Because of the narrow spacing between the second gate electrodes 25b, or high length-to-width ratio of the portion of the N-type base layer 30 sandwiched between the second gate electrodes 25b, electrons are accumulated near the end portion of the second gate electrodes 25b on the first gate electrode 25a side, functioning as an $N^+$-type stopper layer. This also suppresses the depletion layer from extending toward the second P-type base layer 23b.

This is realized not by lengthening the N-type base layer 30, but by the design of the trench gate structure section on the front and rear side. Hence, the N-type base layer 30 can be shortened. Consequently, it is possible to reduce on-resistance and improve switching characteristics while ensuring high breakdown voltage.

Next, if a reverse voltage is applied between the first main electrode 21 and the second main electrode 22 with the first main electrode 21 short-circuited to the first gate electrode 25a and the second main electrode 22 short-circuited to the second gate electrode 25b, then contrary to the above case of forward voltage application, the depletion layer extends from the second gate electrode 25b side toward the first gate electrode 25a side.

That is, in the portion of the N-type base layer 30 sandwiched between the second gate electrodes 25b, the depletion layers extending from the interface with the second gate insulating films 26b on both sides are pinched off, because of the narrow width, or high length-to-width ratio, of that portion.

Then, the depletion layer pinched off between the second gate electrodes 25b extends in the N-type base layer 30 toward the first gate electrode 25a. Here, because of the narrow spacing between the first gate electrodes 25a, or high length-to-width ratio of the portion of the N-type base layer 30 sandwiched between the first gate electrodes 25a, the depletion layer is pinched off and stops extension between the first gate electrodes 25a, not reaching the first P-type base layer 23a.

Furthermore, the first gate electrode 25a is short-circuited to the first main electrode 21 and placed at the potential of the first main electrode 21 (negative potential in the reverse biased case) or a potential close thereto, and carriers (electrons, in this case) are excited in the portion of the N-type base layer 30 opposed to the first gate electrode 25a across the first gate insulating film 26a. Because of the narrow spacing between the first gate electrodes 25a, or high length-to-width ratio of the portion of the N-type base layer 30 sandwiched between the first gate electrodes 25a, electrons are accumulated near the end portion of the first gate electrodes 25a on the second gate electrode 25b side, functioning as an $N^+$-type stopper layer. This also suppresses the depletion layer from extending toward the first P-type base layer 23a.

This is also realized not by lengthening the N-type base layer 30, but by the design of the trench gate structure section on the front and rear side. Hence, the N-type base layer 30 can be shortened. Consequently, also during application of reverse voltage, it is possible to reduce on-resistance and improve switching characteristics while ensuring high breakdown voltage.

Here, also in the structure of this embodiment, the inventor has found that the above function of retaining breakdown voltage can be reliably achieved if the spacing c1 between the first gate electrodes 25a and the spacing c2 between the second gate electrodes 25b are each 200 nm or less, or $c1/d1 < 0.2$, where d1 is the length of the portion of the N-type base layer 30 sandwiched between the first gate electrodes 25a, and $c2/d2 < 0.2$, where d2 is the length of the portion of the N-type base layer 30 sandwiched between the second gate electrodes 25b.

In the model shown in FIG. 6, current-voltage characteristics were simulated under the following conditions: The spacing c1 between the first gate electrodes 25a is c1=200 nm, the spacing c2 between the second gate electrodes 25b is c2=200 nm, the length d1 of the portion of the N-type base layer 30 sandwiched between the first gate electrodes 25a is d1=3 μm, the length d2 of the portion of the N-type base layer 30 sandwiched between the second gate electrodes 25b is d2=3 μm, the lateral length of the first gate electrode 25a is 5 μm, the lateral length of the second gate electrode 25b is 5 μm, and the length of the portion of the N-type base layer 30 between the first gate electrode 25a and the second gate electrode 25b is 90 μm. Then, also in this embodiment, the result obtained is that, as shown in FIG. 3, a breakdown voltage of 6010 V can be achieved in both the forward and reverse direction.

As described above, because of the trench gate structure, this embodiment can also prevent the depletion layer extending from one of the P-type base layers 23a, 23b from reaching the other P-type base layer to achieve high breakdown voltage even if the N-type base layer 30 is shortened. Because the N-type base layer 30 can be shortened, it is possible to reduce on-resistance and improve switching characteristics. Furthermore, because of the symmetric device structure between the first main electrode 21 side and the second main electrode 22 side, an equal breakdown voltage can be ensured in the case of applying maximum forward voltage and in the case of applying maximum reverse voltage. That is, this embodiment can provide a semiconductor device capable of ensuring high breakdown voltage in both the forward and reverse direction without increasing on-resistance and degrading switching characteristics.

Furthermore, by the suitable design of the trench gate structure as described above, high breakdown voltage can be achieved in both the forward and reverse direction with the first main electrode 21 short-circuited to the first gate electrode 25a and the second main electrode 22 short-circuited to the second gate electrode 25b. That is, high breakdown voltage can be ensured in both the forward and reverse direction even without control over the first gate electrode 25a and the second gate electrode 25b by the gate control circuit. Hence, this embodiment can provide a semiconductor device convenient for practical use, which can ensure high breakdown voltage in both the forward and reverse direction even in a situation where no control voltage is supplied from the gate control circuit to the first gate electrode 25a and the second gate electrode 25b, such as during circuit start-up and during the downtime of the gate control circuit due to power outage or failure.

Figure 7A:
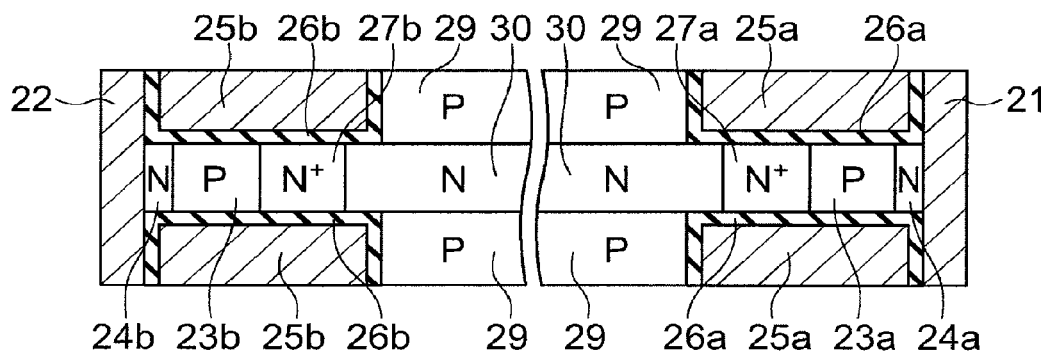
FIGS. 7A to 7C are schematic views showing another example of the semiconductor device according to the fourth embodiment.
Figure 7B:
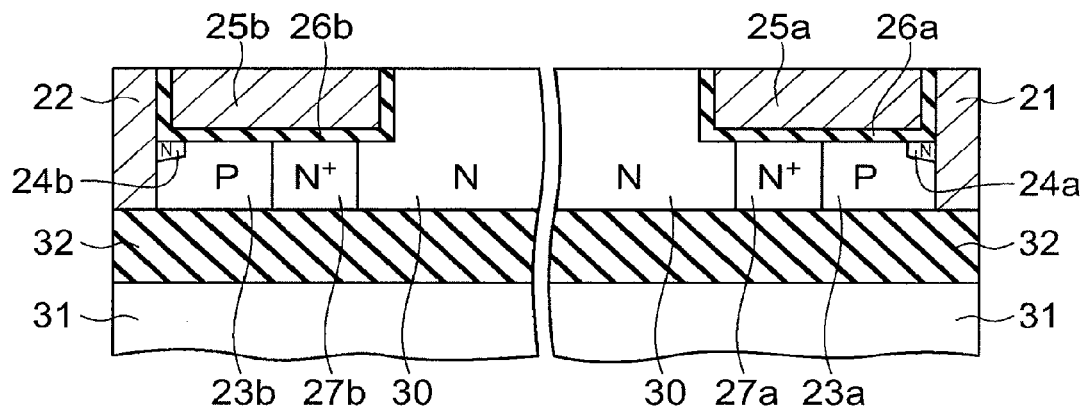

Furthermore, also in this embodiment, as shown in FIG. 7A corresponding to FIG. 6A and in FIG. 7B corresponding to FIG. 6B, an $N^+$-type first stopper layer 27a having a higher N-type impurity concentration than the N-type base layer 30 may be provided in the portion of the N-type base layer 30 in contact with the first P-type base layer 23a, and an $N^+$-type second stopper layer 27b having a higher N-type impurity concentration than the N-type base layer 30 may be provided in the portion of the N-type base layer 30 in contact with the second P-type base layer 23b.

The second stopper layer 27b can suppress the depletion layer from extending to the second P-type base layer 23b during application of forward voltage, and the first stopper layer 27a can suppress the depletion layer from extending to the first P-type base layer 23a during application of reverse voltage. Thus, the effect of enhancing breakdown voltage can be further improved in both the forward and reverse direction.

Here, it is also possible to provide only the second stopper layer 27b, in which case the breakdown voltage during application of forward voltage can be further increased. Alternatively, it is also possible to provide only the first stopper layer 27a, in which case the breakdown voltage during application of reverse voltage can be further increased.

Figure 7C:
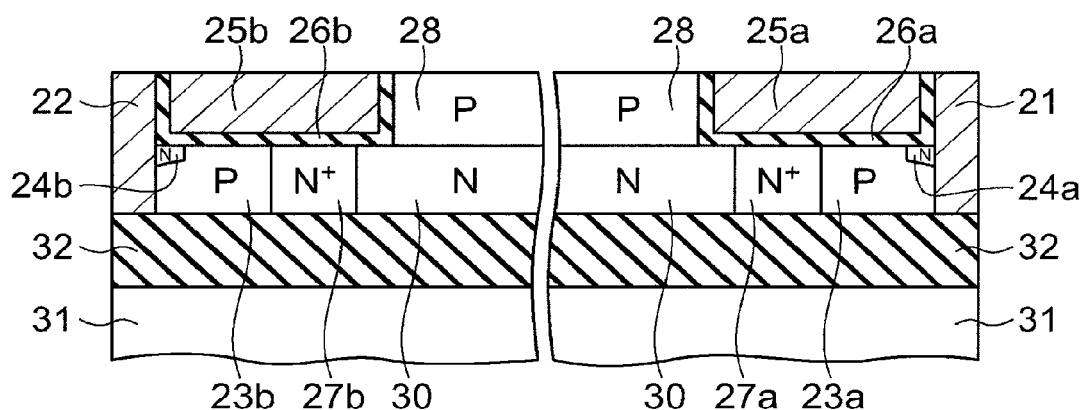

Furthermore, as shown in FIG. 7C, which shows a cross section of the portion similar to that shown in FIG. 7B, a third P-type base layer 28 may be provided on the N-type base layer 30. The N-type base layer 30 is provided in the portion laterally connecting between the first P-type base layer 23a and the second P-type base layer 23b, and the third P-type base layer 28 is provided on the SOI layer in the portion laterally connecting between the first gate electrode 25a and the second gate electrode 25b.

The N-type base layer 30 and the third P-type base layer 28 form a PN junction in the stacking direction. A non-doped layer is artificially produced by equalizing the amount of charge (amount of impurity) contained in the N-type base layer 30 with that contained in the third P-type base layer 28 so that a higher breakdown voltage can be retained. That is, during application of forward voltage or reverse voltage, a higher breakdown voltage can be retained by the depletion layer extending vertically from the PN junction between the N-type base layer 30 and the third P-type base layer 28. Furthermore, while retaining high breakdown voltage, a current is passed through the N-type base layer 30 which is relatively highly doped. Thus, low on-resistance beyond the material limit can be realized.

Alternatively, as shown in FIG. 7A, the N-type base layer 30 and a third P-type base layer 29 may be placed adjacently (to form a PN junction) in the width direction. The N-type base layer 30 is provided in the portion laterally connecting between the first P-type base layer 23a and the second P-type base layer 23b, and the third P-type base layer 29 is provided in the portion laterally connecting between the first gate electrode 25a and the second gate electrode 25b buried in the trenches.

Fifth Embodiment

Figure 8:
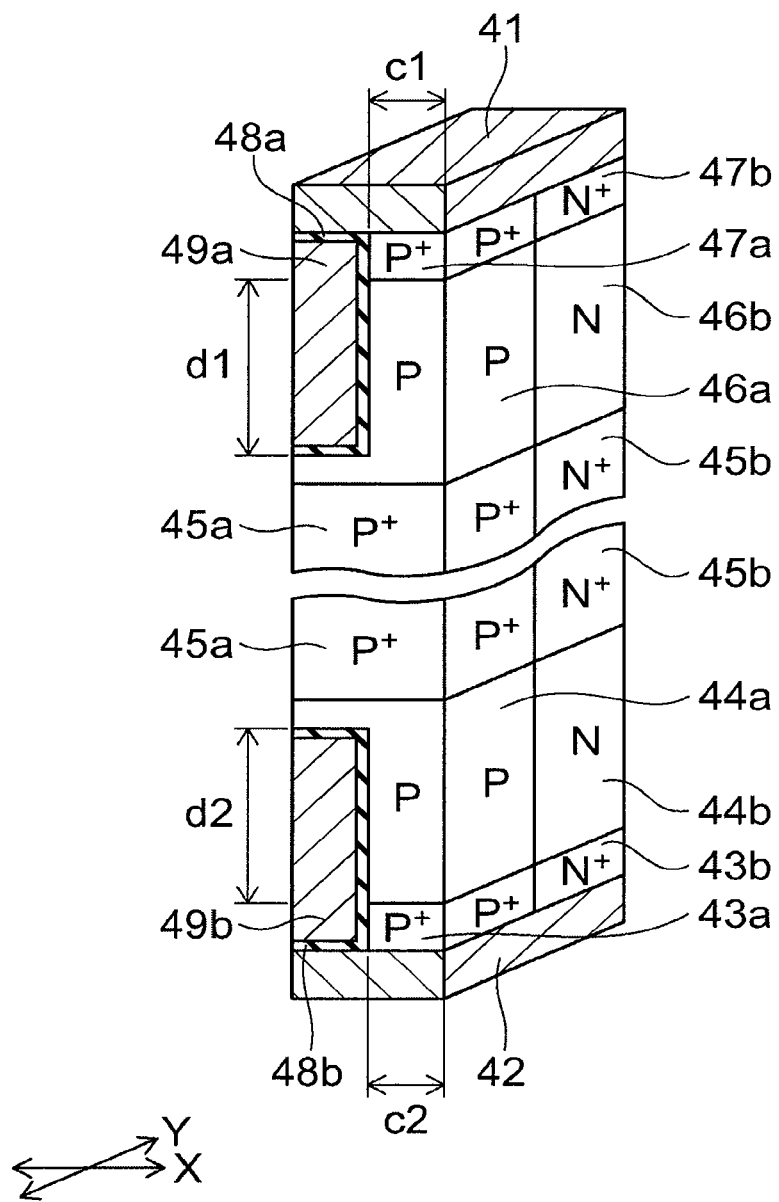
FIG. 8 is a schematic perspective cross-sectional view of a relevant part of a semiconductor device according to a fifth embodiment of the invention.

FIG. 8 is a schematic cross-sectional perspective view of a relevant part of a semiconductor device according to a fifth embodiment of the invention.

Figure 9:
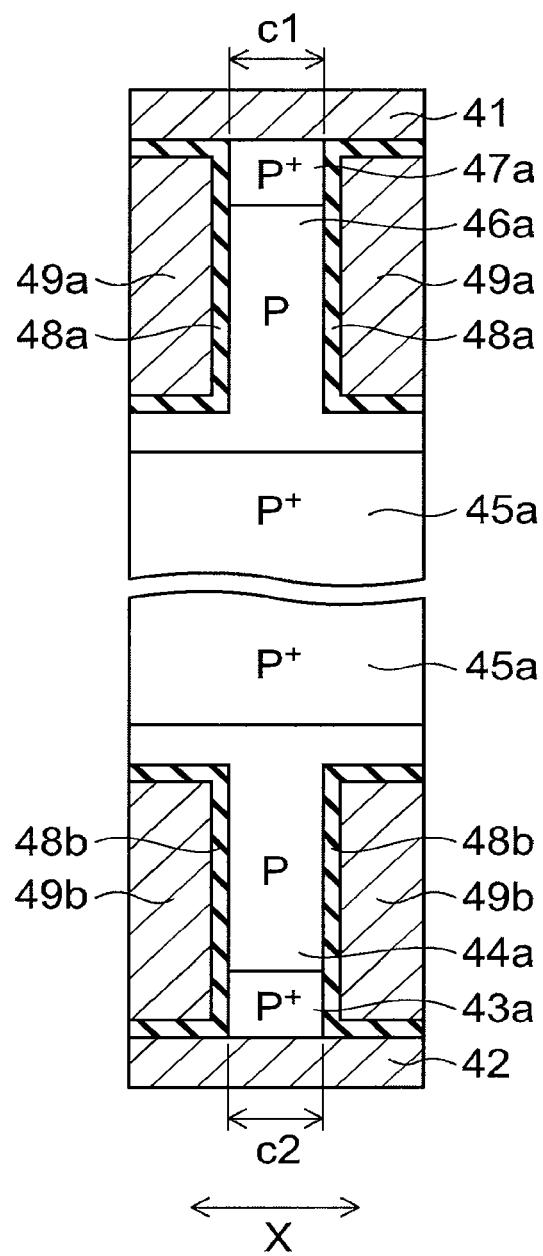
FIG. 9 is a cross-sectional view in the X direction of the P-type semiconductor layer portion in the structure of FIG. 8.

FIG. 9 is a cross-sectional view in the X direction of the P-type semiconductor layer portion in the structure of FIG. 8.

Figure 10:
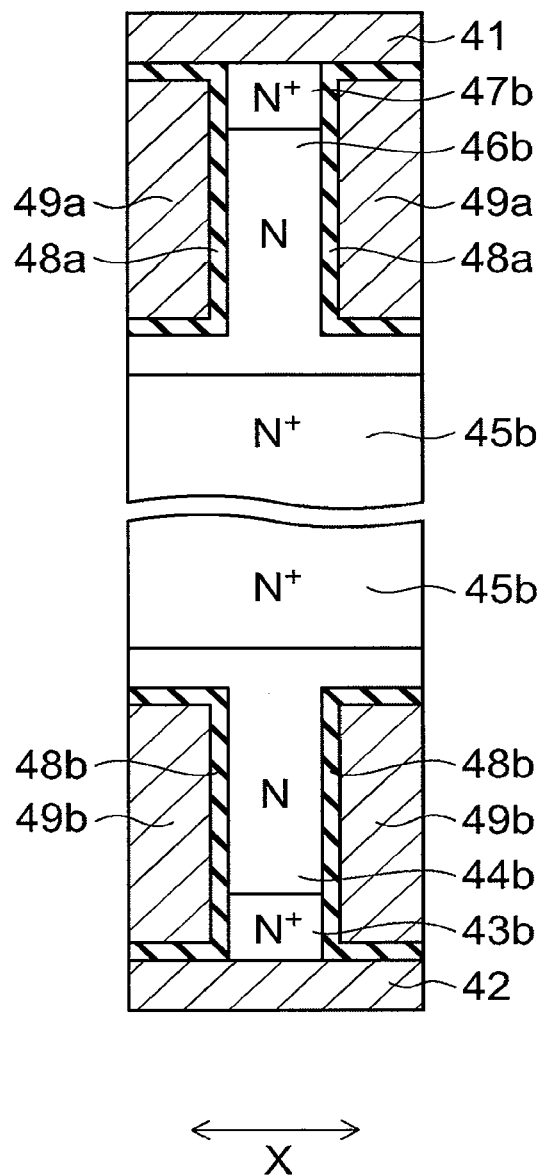
FIG. 10 is a cross-sectional view in the X direction of the N-type semiconductor layer portion in the structure of FIG. 8.

FIG. 10 is a cross-sectional view in the X direction of the N-type semiconductor layer portion in the structure of FIG. 8.

The semiconductor device according to this embodiment is a vertical device in which a current path is formed in the vertical direction connecting between a first main electrode 41 and a second main electrode 42 provided on the front and rear surface, respectively, of a semiconductor layer. Although FIG. 8 shows only the element associated with one trench gate structure, this unit element shown in FIG. 8 is repeated in the X direction (lateral direction) and the Y direction (depth direction in the figure) orthogonal thereto.

The semiconductor device according to this embodiment includes a first to fifth P-type semiconductor layer 43a-47a stacked vertically between the first main electrode 41 and the second main electrode 42, and a first to fifth N-type semiconductor layer 43b-47b likewise stacked vertically and being adjacent to the P-type semiconductor layers.

The second P-type semiconductor layer 44a is provided above the first P-type semiconductor layer 43a, the third P-type semiconductor layer 45a is provided above the second P-type semiconductor layer 44a, the fourth P-type semiconductor layer 46a is provided above the third P-type semiconductor layer 45a, and the fifth P-type semiconductor layer 47a is provided above the fourth P-type semiconductor layer 46a.

The first P-type semiconductor layer 43a, the third P-type semiconductor layer 45a, and the fifth P-type semiconductor layer 47a have higher P-type impurity concentration than the second P-type semiconductor layer 44a and the fourth P-type semiconductor layer 46a.

The second N-type semiconductor layer 44b is provided above the first N-type semiconductor layer 43b, the third N-type semiconductor layer 45b is provided above the second N-type semiconductor layer 44b, the fourth N-type semiconductor layer 46b is provided above the third N-type semiconductor layer 45b, and the fifth N-type semiconductor layer 47b is provided above the fourth N-type semiconductor layer 46b.

The first N-type semiconductor layer 43b, the third N-type semiconductor layer 45b, and the fifth N-type semiconductor layer 47b have higher N-type impurity concentration than the second N-type semiconductor layer 44b and the fourth N-type semiconductor layer 46b.

The first P-type semiconductor layer 43a and the first N-type semiconductor layer 43b are adjacent in the Y direction to form a PN junction, the second P-type semiconductor layer 44a and the second N-type semiconductor layer 44b are adjacent in the Y direction to form a PN junction, the third P-type semiconductor layer 45a and the third N-type semiconductor layer 45b are adjacent in the Y direction to form a PN junction, the fourth P-type semiconductor layer 46a and the fourth N-type semiconductor layer 46b are adjacent in the Y direction to form a PN junction, and the fifth P-type semiconductor layer 47a and the fifth N-type semiconductor layer 47b are adjacent in the Y direction to form a PN junction.

The PN junction structure between the P-type semiconductor layer 43a-47a and the N-type semiconductor layer 43b-47b is periodically repeated in the Y direction.

The first main electrode 41 is provided on the front surface of the fifth P-type semiconductor layer 47a and the fifth N-type semiconductor layer 47b. Thus, the fifth P-type semiconductor layer 47a and the fifth N-type semiconductor layer 47b are electrically connected to the first main electrode 41.

The second main electrode 42 is provided on the rear surface of the first P-type semiconductor layer 43a and the first N-type semiconductor layer 43b. Thus, the first P-type semiconductor layer 43a and the first N-type semiconductor layer 43b are electrically connected to the second main electrode 42.

A plurality of first trenches are formed from the front surface of the fifth P-type semiconductor layer 47a and the fifth N-type semiconductor layer 47b to the fourth P-type semiconductor layer 46a and the fourth N-type semiconductor layer 46b, and a first gate electrode 49a is buried in the first trench via a first gate insulating film 48a. The first gate electrodes 49a are formed in a stripe planar pattern extending in the Y direction (the direction penetrating through the page in FIGS. 9 and 10).

A plurality of second trenches are formed from the front surface (or the rear surface as viewed from the first main electrode 41 side) of the first P-type semiconductor layer 43a and the first N-type semiconductor layer 43b to the second P-type semiconductor layer 44a and the second N-type semiconductor layer 44b, and a second gate electrode 49b is buried in the second trench via a second gate insulating film 48b. The second gate electrodes 49b are also formed in a stripe planar pattern extending in the Y direction.

The first gate electrodes 49a are arranged in a plurality in the X direction as shown in FIGS. 9 and 10, and the fourth P-type semiconductor layer 46a, the fifth P-type semiconductor layer 47a, the fourth N-type semiconductor layer 46b, and the fifth N-type semiconductor layer 47b, with the width narrowed, exist between the adjacent first gate electrodes 49a.

The second gate electrodes 49b are also arranged in a plurality in the X direction as shown in FIGS. 9 and 10, and the second P-type semiconductor layer 44a, the first P-type semiconductor layer 43a, the second N-type semiconductor layer 44b, and the first N-type semiconductor layer 43b, with the width narrowed, exist between the adjacent second gate electrodes 49b.

Here, the state in which the second main electrode 42 is placed at a higher potential than the first main electrode 41 is defined as the state in which a forward voltage is applied between the first main electrode 41 and the second main electrode 42. Conversely, the state in which the first main electrode 41 is placed at a higher potential than the second main electrode 42 is defined as the state in which a reverse voltage is applied between the first main electrode 41 and the second main electrode 42.

The first gate electrode 49a and the second gate electrode 49b are each connected to a gate control circuit, not shown.

Also in this embodiment, by a suitable design of the trench gate structure section, high breakdown voltage can be achieved in both the forward and reverse direction with the gate electrodes 49a, 49b short-circuited to the first main electrode and the second main electrode 42, respectively, even without control over the potential of the gate electrodes 49a, 49b by the gate control circuit, or even in such a situation where the supply of control voltage from the gate control circuit is shut off.

If a forward voltage is applied between the first main electrode 41 and the second main electrode 42 with the first main electrode 41 short-circuited to the first gate electrode 49a and the second main electrode 42 short-circuited to the second gate electrode 49b, then in the portion of the fourth N-type semiconductor layer 46b sandwiched between the first gate electrodes 49a, the depletion layers extending from the interface with the first gate insulating films 48a on both sides are pinched off, because of the narrow width, or high thickness-to-width ratio, of that portion.

Furthermore, because of the narrow width, or high thickness-to-width ratio, of the portion of the second N-type semiconductor layer 44b sandwiched between the second gate electrodes 49b, the depletion layer which has reached the second gate electrodes 49b is pinched off and stops extension between the second gate electrodes 49b, not reaching the second main electrode 42.

Moreover, if a forward voltage is applied between the first main electrode 41 and the second main electrode 42 with the first main electrode 41 short-circuited to the first gate electrode 49a and the second main electrode 42 short-circuited to the second gate electrode 49b, then in the portion of the second P-type semiconductor layer 44a sandwiched between the second gate electrodes 49b, the depletion layers extending from the interface with the second gate insulating films 48b on both sides are pinched off, because of the narrow width, or high thickness-to-width ratio, of that portion.

Furthermore, because of the narrow width, or high thickness-to-width ratio, of the portion of the fourth P-type semiconductor layer 46a sandwiched between the first gate electrodes 49a, the depletion layer which has reached the first gate electrodes 49a is pinched off and stops extension between the first gate electrodes 49a, not reaching the first main electrode 41.

Next, if a reverse voltage is applied between the first main electrode 41 and the second main electrode 42 with the first main electrode 41 short-circuited to the first gate electrode 49a and the second main electrode 42 short-circuited to the second gate electrode 49b, then in the portion of the second N-type semiconductor layer 44b sandwiched between the second gate electrodes 49b, the depletion layers extending from the interface with the second gate insulating films 48b on both sides are pinched off, because of the narrow width, or high thickness-to-width ratio, of that portion.

Furthermore, because of the narrow width, or high thickness-to-width ratio, of the portion of the fourth N-type semiconductor layer 46b sandwiched between the first gate electrodes 49a, the depletion layer which has reached the first gate electrodes 49a is pinched off and stops extension between the first gate electrodes 49a, not reaching the first main electrode 41.

Moreover, if a reverse voltage is applied between the first main electrode 41 and the second main electrode 42 with the first main electrode 41 short-circuited to the first gate electrode 49a and the second main electrode 42 short-circuited to the second gate electrode 49b, then in the portion of the fourth P-type semiconductor layer 46a sandwiched between the first gate electrodes 49a, the depletion layers extending from the interface with the first gate insulating films 48a on both sides are pinched off, because of the narrow width, or high thickness-to-width ratio, of that portion.

Furthermore, because of the narrow width, or high thickness-to-width ratio, of the portion of the second P-type semiconductor layer 44a sandwiched between the second gate electrodes 49b, the depletion layer which has reached the second gate electrodes 49b is pinched off and stops extension between the second gate electrodes 49b, not reaching the second main electrode 42.

Here, the inventor has found that the aforementioned function of retaining breakdown voltage can be reliably achieved if the spacing c1 between the first gate electrodes 49a and the spacing c2 between the second gate electrodes 49b are each 200 nm or less, or c1/d1<0.2, where d1 is the thickness of the portion of the fourth P-type semiconductor layer 46a and the fourth N-type semiconductor layer 46b sandwiched between the first gate electrodes 49a, and c2/d2<0.2, where d2 is the thickness of the portion of the second P-type semiconductor layer 44a and the second N-type semiconductor layer 44b sandwiched between the second gate electrodes 49b.

For the structure of this embodiment, current-voltage characteristics were simulated under the following conditions: The spacing c1 between the first gate electrodes 49a is c1=200 nm, the spacing c2 between the second gate electrodes 49b is c2=200 nm, the thickness d1 of the portion of the fourth P-type semiconductor layer 46a and the fourth N-type semiconductor layer 46b sandwiched between the first gate electrodes 49a is d1=3 µm, the thickness d2 of the portion of the second P-type semiconductor layer 44a and the second N-type semiconductor layer 44b sandwiched between the second gate electrodes 49b is d2=3 µm, the thickness of the first gate electrode 49a (or the depth of the first trench filled therewith) is 5 µm, the thickness of the second gate electrode 49b (or the depth of the second trench filled therewith) is 5 µm, and the thickness of the semiconductor layer between the first gate electrode 49a and the second gate electrode 49b is 15 µm.

As in the aforementioned embodiments, the result obtained is that, as shown in FIG. 3, a breakdown voltage of 6010 V can be achieved in both the forward and reverse direction.

As described above, because of the trench gate structure, this embodiment can also prevent the depletion layer extending from one main electrode side from reaching the other main electrode to achieve high breakdown voltage even if the third P-type semiconductor layer 45a and the third N-type semiconductor layer 45b are thinned. Because the third P-type semiconductor layer 45a and the third N-type semiconductor layer 45b can be thinned, it is possible to reduce on-resistance and improve switching characteristics.

Furthermore, because of the symmetric device structure between the device front side, or the first main electrode 41 side, and the opposite (rear) side, or the second main electrode 42 side, an equal breakdown voltage can be ensured in the case of applying maximum forward voltage and in the case of applying maximum reverse voltage. That is, this embodiment can provide a semiconductor device capable of ensuring high breakdown voltage in both the forward and reverse direction without increasing on-resistance and degrading switching characteristics.

Furthermore, by the suitable design of the trench gate structure as described above, high breakdown voltage can be achieved in both the forward and reverse direction with the first main electrode 41 short-circuited to the first gate electrode 49a and the second main electrode 42 short-circuited to the second gate electrode 49b. That is, high breakdown voltage can be ensured in both the forward and reverse direction even without control over the first gate electrode 49a and the second gate electrode 49b by the gate control circuit. Hence, this embodiment can provide a semiconductor device convenient for practical use, which can ensure high breakdown voltage in both the forward and reverse direction even in a situation where no control voltage is supplied from the gate control circuit to the first gate electrode 49a and the second gate electrode 49b, such as during circuit start-up and during the downtime of the gate control circuit due to power outage or failure.

Furthermore, in this embodiment, the P-type semiconductor layers and the N-type semiconductor layers are adjacent (form a PN junction) alternately in the Y direction in FIG. 8 and periodically arranged to constitute a so-called "super junction structure". In this super junction structure, the function of a non-doped layer or a high-resistance base layer is artificially produced by equalizing the amount of charge (amount of impurity) contained in the P-type semiconductor layer with that contained in the N-type semiconductor layer so that a higher breakdown voltage can be retained. That is, during application of forward voltage or reverse voltage, the breakdown voltage can be retained also by the depletion layer extending in the lateral direction (Y direction) from the PN junction between the P-type semiconductor layer and the N-type semiconductor layer. Furthermore, while retaining high breakdown voltage, a current is passed through the third P-type semiconductor layer 45a and the third N-type semiconductor layer 45b which are relatively highly doped. Thus, low on-resistance beyond the material limit can be realized. That is, because the breakdown voltage is retained also by the depletion layer extending laterally, high breakdown voltage can be retained even if the third P-type semiconductor layer 45a and the third N-type semiconductor layer 45b are relatively thin and have high impurity concentration. Thus, on-resistance can be reduced by the amount of thinning the third P-type semiconductor layer 45a and the third N-type semiconductor layer 45b and by the amount of increasing the impurity concentration therein.

Next, a description is given of the on-operation in which a current is passed between the first main electrode 41 and the second main electrode 42.

If the first gate electrode 49a is placed at a plus potential (such as +15 V) relative to the first main electrode 41, an electron channel is formed, and the overall region having a depth of d1 shown in FIG. 8 on the first main electrode 41 side becomes equivalent to an N-type layer.

If the first gate electrode 49a is placed at a minus potential (such as −15 V) relative to the first main electrode 41, a hole channel is formed, and the overall region having a depth of d1 shown in FIG. 8 on the first main electrode 41 side becomes equivalent to a P-type layer.

If the second gate electrode 49b is placed at a plus potential (such as +15 V) relative to the second main electrode 42, an electron channel is formed, and the overall region having a depth of d2 shown in FIG. 8 on the second main electrode 42 side becomes equivalent to an N-type layer.

If the second gate electrode 49b is placed at a minus potential (such as −15 V) relative to the second main electrode 42, a hole channel is formed, and the overall region having a depth of d2 shown in FIG. 8 on the second main electrode 42 side becomes equivalent to a P-type layer.

If a forward voltage is applied between the first main electrode 41 and the second main electrode 42, and a positive potential is applied to the first gate electrode 49a with the first main electrode 41 placed at 0 V or a negative potential, then an N-type channel is formed in the fourth P-type semiconductor layer 46a and the fourth N-type semiconductor layer 46b opposed to the first gate electrode 49a across the first gate insulating film 48a. If a negative potential is applied to the second gate electrode 49b with the second main electrode 42 placed at a positive potential, then a P-type channel is formed in the second P-type semiconductor layer 44a and the second N-type semiconductor layer 44b opposed to the second gate electrode 49b across the second gate insulating film 48b. That is, in this case, a current flows between the first main electrode and the second main electrode 42 through the aforementioned N-type channel and P-type channel, causing bipolar operation.

In the above state of forward voltage application, if a positive potential is applied to the second gate electrode 49b, then an N-type channel is formed in the second P-type semiconductor layer 44a and the second N-type semiconductor layer 44b opposed to the second gate electrode 49b across the second gate insulating film 48b. That is, an N-type channel is formed in both the first main electrode 41 side and the second main electrode 42 side, causing unipolar operation.

In the above state of forward voltage application, if a negative potential is applied to the first gate electrode 49a, then a P-type channel is formed in the fourth P-type semiconductor layer 46a and the fourth N-type semiconductor layer 46b opposed to the first gate electrode 49a across the first gate insulating film 48a. That is, a P-type channel is formed in both the first main electrode 41 side and the second main electrode 42 side, causing unipolar operation.

If a reverse voltage is applied between the first main electrode 41 and the second main electrode 42, and a positive potential is applied to the second gate electrode 49b with the second main electrode 42 placed at 0 V or a negative potential, then an N-type channel is formed in the second P-type semiconductor layer 44a and the second N-type semiconductor layer 44b opposed to the second gate electrode 49b across the second gate insulating film 48b. If a negative potential is applied to the first gate electrode 49a with the first main electrode 41 placed at a positive potential, then a P-type channel is formed in the fourth P-type semiconductor layer 46a and the fourth N-type semiconductor layer 46b opposed to the first gate electrode 49a across the first gate insulating film 48a. That is, in this case, a current flows between the first main electrode 41 and the second main electrode 42 through the aforementioned N-type channel and P-type channel, causing bipolar operation.

In the above state of reverse voltage application, if a positive potential is applied to the first gate electrode 49a, then an N-type channel is formed in the fourth P-type semiconductor layer 46a and the fourth N-type semiconductor layer 46b opposed to the first gate electrode 49a across the first gate insulating film 48a. That is, an N-type channel is formed in both the first main electrode 41 side and the second main electrode 42 side, causing unipolar operation.

In the above state of reverse voltage application, if a negative potential is applied to the second gate electrode 49b, then a P-type channel is formed in the second P-type semiconductor layer 44a and the second N-type semiconductor layer 44b opposed to the second gate electrode 49b across the second gate insulating film 48b. That is, a P-type channel is formed in both the first main electrode 41 side and the second main electrode 42 side, causing unipolar operation.

Sixth Embodiment

FIG. 11 is a schematic cross-sectional view of a relevant part of a semiconductor device according to a sixth embodiment of the invention.

The semiconductor device according to this embodiment is a lateral device having an SOI (silicon on insulator) structure in which a current path is formed in the lateral direction connecting between a first main electrode 51 and a second main electrode 52 spaced from each other on an insulating layer 32 provided on a semiconductor substrate (or semiconductor layer) 31.

Figure 11A:
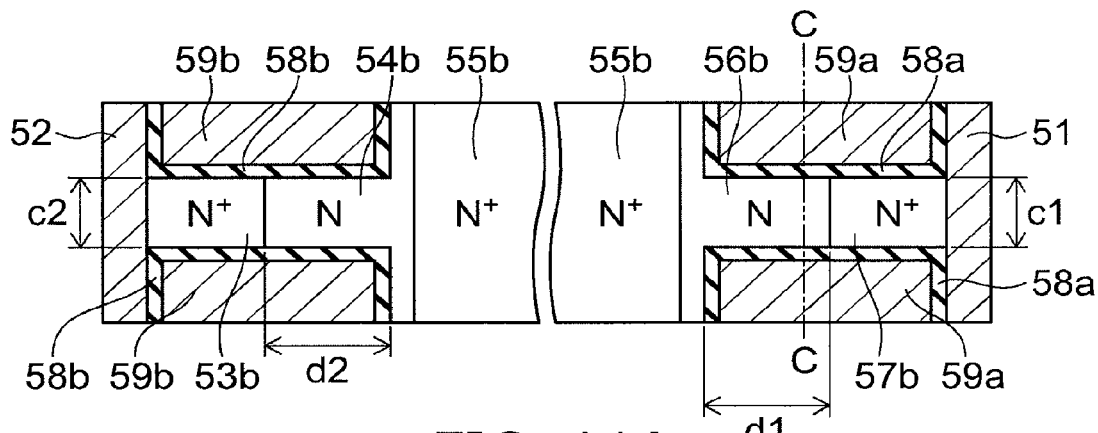
FIGS. 11A to 11C are schematic cross-sectional views of a relevant part of a semiconductor device according to a sixth embodiment of the invention.
Figure 11B:
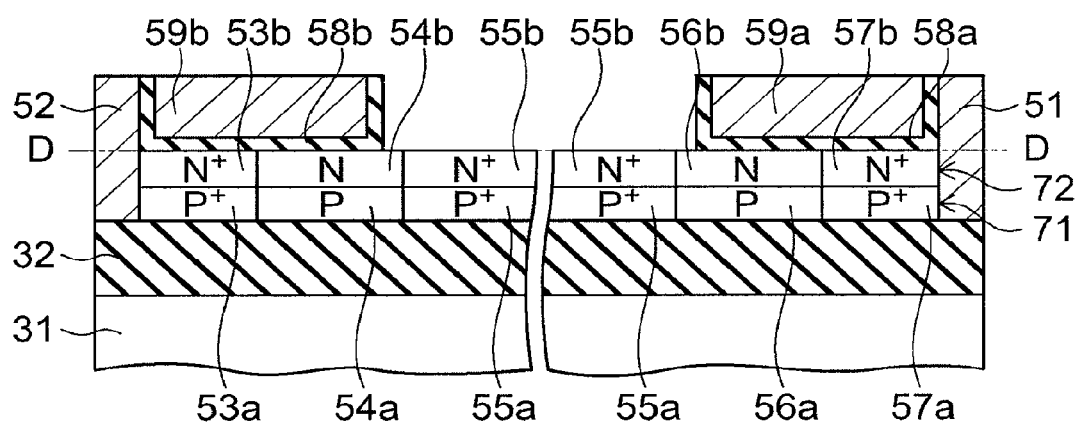
Figure 11C:
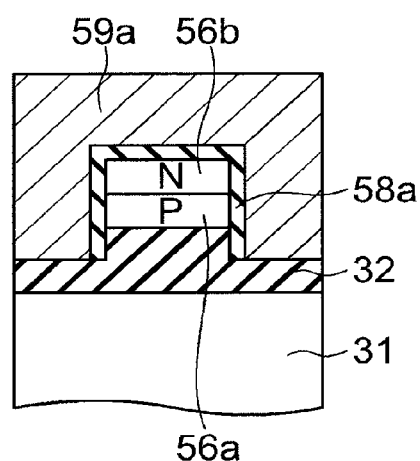

FIG. 11B shows a cross section in the direction connecting between the first main electrode 51 and the second main electrode 52, FIG. 11A shows the D-D cross section in FIG. 11B, and FIG. 11C shows the C-C cross section in FIG. 11A.

A P-type semiconductor layer 71 and an N-type semiconductor layer 72 are stacked on the insulating layer 32. In the configuration shown in FIG. 11B, the P-type semiconductor layer 71 is provided on the insulating layer 32, and the N-type semiconductor layer 72 is provided on the P-type semiconductor layer 71. However, as an alternative configuration, the N-type semiconductor layer 72 may be provided on the insulating layer 32, and the P-type semiconductor layer 71 may be provided on the N-type semiconductor layer 72.

The P-type semiconductor layer 71 includes a first to fifth P-type semiconductor layer 53a-57a. The second P-type semiconductor layer 54a is adjacent to the first P-type semiconductor layer 53a, the third P-type semiconductor layer 55a is adjacent to the second P-type semiconductor layer 54a, the fourth P-type semiconductor layer 56a is adjacent to the third P-type semiconductor layer 55a, and the fifth P-type semiconductor layer 57a is adjacent to the fourth P-type semiconductor layer 56a.

The first P-type semiconductor layer 53a, the third P-type semiconductor layer 55a, and the fifth P-type semiconductor layer 57a have higher P-type impurity concentration than the second P-type semiconductor layer 54a and the fourth P-type semiconductor layer 56a.

The N-type semiconductor layer 72 includes a first to fifth N-type semiconductor layer 53b-57b. The first N-type semiconductor layer 53b is stacked on the first P-type semiconductor layer 53a. The second N-type semiconductor layer 54b is stacked on the second P-type semiconductor layer 54a and adjacent to the first N-type semiconductor layer 53b. The third N-type semiconductor layer 55b is stacked on the third P-type semiconductor layer 55a and adjacent to the second N-type semiconductor layer 54b. The fourth N-type semiconductor layer 56b is stacked on the fourth P-type semiconductor layer 56a and adjacent to the third N-type semiconductor layer 55b. The fifth N-type semiconductor layer 57b is stacked on the fifth P-type semiconductor layer 57a and adjacent to the fourth N-type semiconductor layer 56b.

The first N-type semiconductor layer 53b, the third N-type semiconductor layer 55b, and the fifth N-type semiconductor layer 57b have higher N-type impurity concentration than the second N-type semiconductor layer 54b and the fourth N-type semiconductor layer 56b.

As shown in FIG. 11A, a plurality of first trenches reaching the insulating layer 32 are formed in the fourth N-type semiconductor layer 56b, the fourth P-type semiconductor layer 56a therebelow, the fifth N-type semiconductor layer 57b, and the fifth P-type semiconductor layer 57a therebelow. A first gate electrode 59a is buried in the first trench via a first gate insulating film 58a.

A plurality of second trenches reaching the insulating layer 32 are formed in the second N-type semiconductor layer 54b, the second P-type semiconductor layer 54a therebelow, the first N-type semiconductor layer 53b, and the first P-type semiconductor layer 53a therebelow. A second gate electrode 59b is buried in the second trench via a second gate insulating film 58b.

As shown in FIGS. 11B and 11C, the first gate electrodes 59a buried in the respective trenches are connected on the surface of the fourth N-type semiconductor layer 56b and the fifth N-type semiconductor layer 57b. That is, the first gate electrode 59a is provided also on the surface of the fourth N-type semiconductor layer 56b and the fifth N-type semiconductor layer 57b via the first gate insulating film 58a.

Likewise, the second gate electrodes 59b buried in the respective trenches are connected on the surface of the first N-type semiconductor layer 53b and the second N-type semiconductor layer 54b. That is, the second gate electrode 59b is provided also on the surface of the first N-type semiconductor layer 53b and the second N-type semiconductor layer 54b via the second gate insulating film 58b.

The first main electrode 51 is provided on the insulating layer 32 so as to be in contact with the fifth P-type semiconductor layer 57a and the fifth N-type semiconductor layer 57b. Thus, the fifth P-type semiconductor layer 57a and the fifth N-type semiconductor layer 57b are electrically connected to the first main electrode 51. The second main electrode 52 is provided on the insulating layer 32 so as to be in contact with the first P-type semiconductor layer 53a and the first N-type semiconductor layer 53b. Thus, the first P-type semiconductor layer 53a and the first N-type semiconductor layer 53b are electrically connected to the second main electrode 52.

Here, the state in which the second main electrode 52 is placed at a higher potential than the first main electrode 51 is defined as the state in which a forward voltage is applied between the first main electrode 51 and the second main electrode 52. Conversely, the state in which the first main electrode 51 is placed at a higher potential than the second main electrode 52 is defined as the state in which a reverse voltage is applied between the first main electrode 51 and the second main electrode 52.

The first gate electrode 59*a* and the second gate electrode 59*b* are each connected to a gate control circuit, not shown.

Also in this embodiment, by a suitable design of the trench gate structure section, high breakdown voltage can be achieved in both the forward and reverse direction with the gate electrodes 59*a*, 59*b* short-circuited to the first main electrode and the second main electrode 52, respectively, even without control over the potential of the gate electrodes 59*a*, 59*b* by the gate control circuit, or even in such a situation where the supply of control voltage from the gate control circuit is shut off.

If a forward voltage is applied between the first main electrode 51 and the second main electrode 52 with the first main electrode 51 short-circuited to the first gate electrode 59*a* and the second main electrode 52 short-circuited to the second gate electrode 59*b*, then in the portion of the fourth N-type semiconductor layer 56*b* sandwiched between the first gate electrodes 59*a*, the depletion layers extending from the interface with the first gate insulating films 58*a* on both sides are pinched off, because of the narrow width, or high length-to-width ratio, of that portion.

Furthermore, because of the narrow width, or high length-to-width ratio, of the portion of the second N-type semiconductor layer 54*b* sandwiched between the second gate electrodes 59*b*, the depletion layer which has reached the second gate electrodes 59*b* is pinched off and stops extension between the second gate electrodes 59*b*, not reaching the second main electrode 52.

Moreover, if a forward voltage is applied between the first main electrode 51 and the second main electrode 52 with the first main electrode 51 short-circuited to the first gate electrode 59*a* and the second main electrode 52 short-circuited to the second gate electrode 59*b*, then in the portion of the second P-type semiconductor layer 54*a* sandwiched between the second gate electrodes 59*b*, the depletion layers extending from the interface with the second gate insulating films 58*b* on both sides are pinched off, because of the narrow width, or high length-to-width ratio, of that portion.

Furthermore, because of the narrow width, or high length-to-width ratio, of the portion of the fourth P-type semiconductor layer 56*a* sandwiched between the first gate electrodes 59*a*, the depletion layer which has reached the first gate electrodes 59*a* is pinched off and stops extension between the first gate electrodes 59*a*, not reaching the first main electrode 51.

Next, if a reverse voltage is applied between the first main electrode 51 and the second main electrode 52 with the first main electrode 51 short-circuited to the first gate electrode 59*a* and the second main electrode 52 short-circuited to the second gate electrode 59*b*, then in the portion of the second N-type semiconductor layer 54*b* sandwiched between the second gate electrodes 59*b*, the depletion layers extending from the interface with the second gate insulating films 58*b* on both sides are pinched off, because of the narrow width, or high length-to-width ratio, of that portion.

Furthermore, because of the narrow width, or high length-to-width ratio, of the portion of the fourth N-type semiconductor layer 56*b* sandwiched between the first gate electrodes 59*a*, the depletion layer which has reached the first gate electrodes 59*a* is pinched off and stops extension between the first gate electrodes 59*a*, not reaching the first main electrode 51.

Moreover, if a reverse voltage is applied between the first main electrode 51 and the second main electrode 52 with the first main electrode 51 short-circuited to the first gate electrode 59*a* and the second main electrode 52 short-circuited to the second gate electrode 59*b*, then in the portion of the fourth P-type semiconductor layer 56*a* sandwiched between the first gate electrodes 59*a*, the depletion layers extending from the interface with the first gate insulating films 58*a* on both sides are pinched off, because of the narrow width, or high length-to-width ratio, of that portion.

Furthermore, because of the narrow width, or high length-to-width ratio, of the portion of the second P-type semiconductor layer 54*a* sandwiched between the second gate electrodes 59*b*, the depletion layer which has reached the second gate electrodes 59*b* is pinched off and stops extension between the second gate electrodes 59*b*, not reaching the second main electrode 52.

Here, the inventor has found that the aforementioned function of retaining breakdown voltage can be reliably achieved if the spacing c1 between the first gate electrodes 59*a* and the spacing c2 between the second gate electrodes 59*b* are each 200 nm or less, or $c1/d1<0.2$, where d1 is the length of the portion of the fourth P-type semiconductor layer 56*a* and the fourth N-type semiconductor layer 56*b* sandwiched between the first gate electrodes 59*a*, and $c2/d2<0.2$, where d2 is the length of the portion of the second P-type semiconductor layer 54*a* and the second N-type semiconductor layer 54*b* sandwiched between the second gate electrodes 59*b*.

For the structure of this embodiment, current-voltage characteristics were simulated under the following conditions: The spacing c1 between the first gate electrodes 59*a* is c1=200 nm, the spacing c2 between the second gate electrodes 59*b* is c2=200 nm, the length d1 of the portion of the fourth P-type semiconductor layer 56*a* and the fourth N-type semiconductor layer 56*b* sandwiched between the first gate electrodes 59*a* is d1=3 μm, the length d2 of the portion of the second P-type semiconductor layer 54*a* and the second N-type semiconductor layer 54*b* sandwiched between the second gate electrodes 59*b* is d2=3 μm, the length of the first gate electrode 59*a* is 5 μm, the length of the second gate electrode 59*b* is 5 μm, and the length of the semiconductor layers including the third N-type semiconductor layer 55*b* and the third P-type semiconductor layer 55*a* between the first gate electrode 59*a* and the second gate electrode 59*b* is 15 μm.

As in the aforementioned embodiments, the result obtained is that, as shown in FIG. 3, a breakdown voltage of 6010 V can be achieved in both the forward and reverse direction.

As described above, because of the trench gate structure, this embodiment can also prevent the depletion layer extending from one main electrode side from reaching the other main electrode to achieve high breakdown voltage even if the third P-type semiconductor layer 55*a* and the third N-type semiconductor layer 55*b* are shortened. Because the third P-type semiconductor layer 55*a* and the third N-type semiconductor layer 55*b* can be shortened, it is possible to reduce on-resistance and improve switching characteristics.

Furthermore, because of the symmetric device structure between the first main electrode 51 side and the second main electrode 52 side, an equal breakdown voltage can be ensured in the case of applying maximum forward voltage and in the case of applying maximum reverse voltage. That is, this embodiment can provide a semiconductor device capable of ensuring high breakdown voltage in both the forward and reverse direction without increasing on-resistance and degrading switching characteristics.

Furthermore, by the suitable design of the trench gate structure as described above, high breakdown voltage can be achieved in both the forward and reverse direction with the first main electrode 51 short-circuited to the first gate electrode 59a and the second main electrode 52 short-circuited to the second gate electrode 59b. That is, high breakdown voltage can be ensured in both the forward and reverse direction even without control over the first gate electrode 59a and the second gate electrode 59b by the gate control circuit. Hence, this embodiment can provide a semiconductor device convenient for practical use, which can ensure high breakdown voltage in both the forward and reverse direction even in a situation where no control voltage is supplied from the gate control circuit to the first gate electrode 59a and the second gate electrode 59b, such as during circuit start-up and during the downtime of the gate control circuit due to power outage or failure.

Furthermore, in the structure of this embodiment, the P-type semiconductor layer 71 and the N-type semiconductor layer 72 form a PN junction in the stacking direction. Thus, a non-doped layer is artificially produced by equalizing the amount of charge (amount of impurity) contained in the P-type semiconductor layer 71 with that contained in the N-type semiconductor layer 72 so that a higher breakdown voltage can be retained. That is, during application of forward voltage or reverse voltage, the breakdown voltage can be retained also by the depletion layer extending in the stacking direction from the PN junction between the P-type semiconductor layer 71 and the N-type semiconductor layer 72.

Furthermore, while retaining high breakdown voltage, a current is passed through the third P-type semiconductor layer 55a and the third N-type semiconductor layer 55b which are relatively highly doped. Thus, low on-resistance beyond the material limit can be realized. That is, because the breakdown voltage is retained also by the depletion layer extending in the stacking direction, high breakdown voltage can be retained even if the third P-type semiconductor layer 55a and the third N-type semiconductor layer 55b are relatively short and have high impurity concentration. Thus, on-resistance can be reduced by the amount of shortening the third P-type semiconductor layer 55a and the third N-type semiconductor layer 55b and by the amount of increasing the impurity concentration therein.

Next, a description is given of the on-operation in which a current is passed between the first main electrode 51 and the second main electrode 52.

If a forward voltage is applied between the first main electrode 51 and the second main electrode 52, and a positive potential is applied to the first gate electrode 59a with the first main electrode 51 placed at 0 V or a negative potential, then an N-type channel is formed in the fourth P-type semiconductor layer 56a and the fourth N-type semiconductor layer 56b opposed to the first gate electrode 59a across the first gate insulating film 58a. If a negative potential is applied to the second gate electrode 59b with the second main electrode 52 placed at a positive potential, then a P-type channel is formed in the second P-type semiconductor layer 54a and the second N-type semiconductor layer 54b opposed to the second gate electrode 59b across the second gate insulating film 58b. That is, in this case, a current flows between the first main electrode and the second main electrode 52 through the aforementioned N-type channel and P-type channel, causing bipolar operation.

In the above state of forward voltage application, if a positive potential is applied to the second gate electrode 59b, then an N-type channel is formed in the second P-type semiconductor layer 54a and the second N-type semiconductor layer 54b opposed to the second gate electrode 59b across the second gate insulating film 58b. That is, an N-type channel is formed in both the first main electrode 51 side and the second main electrode 52 side, causing unipolar operation.

In the above state of forward voltage application, if a negative potential is applied to the first gate electrode 59a, then a P-type channel is formed in the fourth P-type semiconductor layer 56a and the fourth N-type semiconductor layer 56b opposed to the first gate electrode 59a across the first gate insulating film 58a. That is, a P-type channel is formed in both the first main electrode 51 side and the second main electrode 52 side, causing unipolar operation.

If a reverse voltage is applied between the first main electrode 51 and the second main electrode 52, and a positive potential is applied to the second gate electrode 59b with the second main electrode 52 placed at 0 V or a negative potential, then an N-type channel is formed in the second P-type semiconductor layer 54a and the second N-type semiconductor layer 54b opposed to the second gate electrode 59b across the second gate insulating film 58b. If a negative potential is applied to the first gate electrode 59a with the first main electrode 51 placed at a positive potential, then a P-type channel is formed in the fourth P-type semiconductor layer 56a and the fourth N-type semiconductor layer 56b opposed to the first gate electrode 59a across the first gate insulating film 58a. That is, in this case, a current flows between the first main electrode 51 and the second main electrode 52 through the aforementioned N-type channel and P-type channel, causing bipolar operation.

In the above state of reverse voltage application, if a positive potential is applied to the first gate electrode 59a, then an N-type channel is formed in the fourth P-type semiconductor layer 56a and the fourth N-type semiconductor layer 56b opposed to the first gate electrode 59a across the first gate insulating film 58a. That is, an N-type channel is formed in both the first main electrode 51 side and the second main electrode 52 side, causing unipolar operation.

In the above state of reverse voltage application, if a negative potential is applied to the second gate electrode 59b, then a P-type channel is formed in the second P-type semiconductor layer 54a and the second N-type semiconductor layer 54b opposed to the second gate electrode 59b across the second gate insulating film 58b. That is, a P-type channel is formed in both the first main electrode 51 side and the second main electrode 52 side, causing unipolar operation.

Furthermore, in this embodiment, as shown in FIG. 11C, the trench and the first gate electrode 59a buried therein are formed so as to penetrate into the insulating layer 32 more deeply than the interface between the insulating layer 32 and the SOI layer in which the fourth N-type semiconductor layer 56b and the fourth P-type semiconductor layer 56a are formed. Likewise, the trench and the second gate electrode 59b buried therein are also formed so as to penetrate into the insulating layer 32 more deeply than the interface between the insulating layer 32 and the SOI layer in which the second N-type semiconductor layer 54b and the second P-type semiconductor layer 54a are formed. This structure allows the potential of the first gate electrode 59a and the second gate electrode 59b to be readily applied to the rear side of the SOI layer as well, and can reduce the effect of the substrate potential on the SOI layer.

In the above embodiments, the depletion layer extending from the first gate electrode side is stopped due to the geometric shape of the second gate electrodes, and the depletion layer extending from the second gate electrode side is stopped due to the geometric shape of the first gate electrodes.

The planar pattern of the first gate electrodes and the second gate electrodes is not limited to a stripe pattern, but may be mesh or other patterns as long as the pattern satisfies the requirements for geometric shape and dimension to function as a stopper for the depletion layer.

The spacing c1 between the first gate electrodes and the spacing c2 between the second gate electrodes may be related as c1=c2, c1>c2, or c1<c2.

Seventh Embodiment

Figure 12:
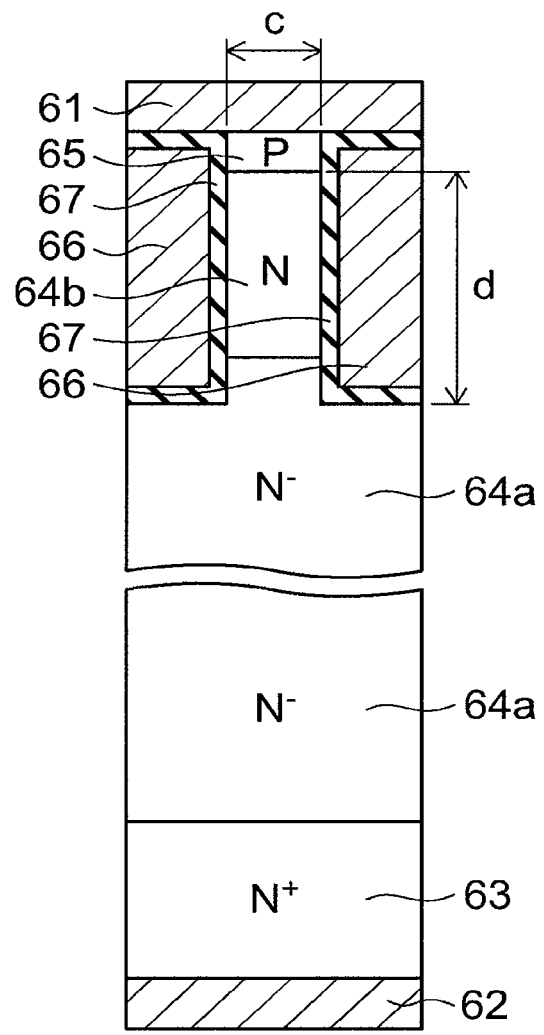
FIG. 12 is a schematic cross-sectional view of a relevant part of a semiconductor device according to a seventh embodiment of the invention.

FIG. 12 is a schematic cross-sectional view of a relevant part of a semiconductor device according to a seventh embodiment of the invention.

The semiconductor device according to this embodiment is a vertical device in which a current path is formed in the vertical direction connecting between a first main electrode 61 and a second main electrode 62 provided on the front and rear surface, respectively, of a semiconductor layer.

The semiconductor device according to this embodiment has a diode structure with an $N^+$-type emitter layer 63, an $N^-$-type semiconductor layer 64a, an N-type semiconductor layer 64b, and a P-type semiconductor layer 65 provided between the first main electrode 61 and the second main electrode 62, sequentially from the second main electrode 62 side.

The $N^+$-type emitter layer 63 is provided in contact with the second main electrode 62 and electrically connected to the second main electrode 62. On the $N^+$-type emitter layer 63 is provided the $N^-$-type semiconductor layer 64a, which has a lower N-type impurity concentration than the $N^+$-type emitter layer 63. On the $N^-$-type semiconductor layer 64a is provided the N-type semiconductor layer 64b, which has a lower N-type impurity concentration than the $N^+$-type emitter layer 63 and a higher N-type impurity concentration than the $N^-$-type semiconductor layer 64a. On the N-type semiconductor layer 64b is provided the P-type semiconductor layer 65, which forms a PN junction with the N-type semiconductor layer 64b. The first main electrode 61 is provided on the P-type semiconductor layer 65, and the P-type semiconductor layer 65 is electrically connected to the first main electrode 61.

A plurality of trenches are formed from the surface of the P-type semiconductor layer 65 through the N-type semiconductor layer 64b to the $N^-$-type semiconductor layer 64a, and a gate electrode 66 is buried in the trench via a gate insulating film 67. The gate electrodes 66 are formed in a stripe planar pattern extending in a direction penetrating through the page.

Here, the state in which the first main electrode 61 is placed at a higher potential than the second main electrode 62 is defined as the state in which a forward voltage is applied between the first main electrode 61 and the second main electrode 62. Conversely, the state in which the second main electrode 62 is placed at a higher potential than the first main electrode 61 is defined as the state in which a reverse voltage is applied between the first main electrode 61 and the second main electrode 62. The gate electrode 66 is connected to a gate control circuit, not shown.

If a forward voltage is applied between the first main electrode 61 and the second main electrode 62, a forward current flows between the first main electrode 61 and the second main electrode 62. Here, a desired control potential is applied to the gate electrode 66 by a gate control circuit, not shown. Alternatively, the gate electrode 66 may be short-circuited to the first main electrode 61.

If a reverse voltage is applied between the first main electrode 61 and the second main electrode 62 with the first main electrode 61 short-circuited to the gate electrode 66, then in the portion of the N-type semiconductor layer 64b sandwiched between the gate electrodes 66, the depletion layers extending from the PN junction with the P-type semiconductor layer 65 and the interface with the gate insulating films 67 on both sides are pinched off, because of the narrow width, or high aspect ratio (ratio of thickness to width), of that portion. Then, the depletion layer pinched off between the gate electrodes 66 extends in the $N^-$-type semiconductor layer 64a toward the second main electrode 62, and stops its extension in the $N^+$-type emitter layer 63, not reaching the second main electrode 62. Thus, high reverse breakdown voltage can be achieved.

Here, the inventor has found that the above function of retaining reverse breakdown voltage can be reliably achieved if the spacing c between the gate electrodes 66 is 200 nm or less, or c/d<0.2, where d is the thickness of the portion of the N-type semiconductor layer 64b and the $N^-$-type semiconductor layer 64a sandwiched between the gate electrodes 66.

Furthermore, by the suitable design of the trench gate structure as described above, high reverse breakdown voltage can be achieved with the first main electrode 61 short-circuited to the gate electrode 66. That is, high reverse breakdown voltage can be ensured even without control over the gate electrode 66 by the gate control circuit. Hence, this embodiment can provide a semiconductor device convenient for practical use, which can ensure high reverse breakdown voltage even in a situation where no control voltage is supplied from the gate control circuit to the gate electrode 66, such as during circuit start-up and during the downtime of the gate control circuit due to power outage or failure.

In general, a PN junction diode has the problem of tail current during the reverse recovery (turn-off) time due to carrier plasma of electrons and holes, which are accumulated in the high-resistance base layer (corresponding to the $N^-$-type semiconductor layer 64a in this embodiment) during on-time under application of forward voltage. Thus, PN junction diodes are inferior to Schottky barrier diodes in reverse recovery loss and switching rate. To avoid this problem, it is contemplated to decrease the P-type impurity concentration in the P-type semiconductor layer 65 to reduce the carrier injection efficiency, thereby improving reverse recovery characteristics.

However, if the P-type impurity concentration in the P-type semiconductor layer 65 is decreased, the depletion layer extends more easily in the P-type semiconductor layer 65 during application of reverse voltage. Thus, the depletion layer may reach the first main electrode 61 and result in punch-through, causing concern about decrease of breakdown voltage.

As described above, this embodiment achieves high reverse breakdown voltage by suitably designing the trench gate structure. Hence, high reverse breakdown voltage can be achieved even if the P-type impurity concentration in the P-type semiconductor layer 65 is decreased. The inventor's simulation confirmed that high reverse breakdown voltage is obtained even if the impurity dose amount Q in the P-type semiconductor layer 65 is in the range of $1\times10^9<Q<1\times10^{12}$ ($cm^{-2}$).

Thus, by decreasing the P-type impurity concentration in the P-type semiconductor layer 65, the carrier injection efficiency during on-time under application of forward voltage is reduced, improving reverse recovery characteristics and achieving fast switching.

Conventionally, to ensure breakdown voltage and reliability of a power device, the impurity dose amount Q on the low-resistance side (corresponding to the aforementioned impurity dose amount in the P-type semiconductor layer 65) needs to be $Q \geq 1 \times 10^{12}$ (cm$^{-2}$). Hence, because of the lower bound to the impurity dose amount on the low-resistance side, it has been impossible to reduce the injection efficiency below a certain value by using the difference from the impurity concentration on the high-resistance side.

However, in this embodiment, thanks to the aforementioned effect of the fine trench structure (the structure in which pseudo PN junctions are formed at a fine gate-to-gate spacing), the impurity concentration on the low-resistance side can be decreased, independent of the breakdown voltage and reliability of the power device, to a level at which the reliability of breakdown voltage could not be ensured conventionally. As a result, according to this embodiment, by decreasing the efficiency of carrier injection from the low-resistance side of the trench, a faster diode can be realized.

In the above embodiments, the thickness of the inversion layer (accumulation layer) generated in the semiconductor layer opposed to the electrode across the oxide film by the potential difference occurring between the trench surface (main electrode side) and the trench bottom is approximately several nm to several ten nm. To use the potential of this inversion layer as a stopper for the depletion layer, preferably, the trench-to-trench spacing c in the trench gate structure is several nm to several ten nm, and the trench depth d is d>c. As d becomes larger, the potential difference occurring between the trench surface (main electrode side) and the trench bottom increases, hence enhancing the effect as a stopper for the depletion layer. For c/d<0.2 (more reliably, c/d<0.1), c is 200 nm or less, achieving the effect as a stopper. For a buried gate trench with suitable application of gate voltage, even c<1 µm is effective.

The embodiments of the invention have been described with reference to examples. However, the invention is not limited thereto, but can be variously modified within the spirit of the invention.

The invention claimed is:

1. A semiconductor device comprising:
a semiconductor layer including:
an N-type base layer;
a first P-type base layer on a first side of the N-type base layer;
a second P-type base layer on a second side of the N-type base layer, the N-type base layer being between the first and second P-type base layers in a first direction;
a plurality of first gate electrodes provided on a first insulating film on the first side of the N-type base layer, the plurality of first gate electrodes spaced from each other in a second direction crossing the first direction, at least a portion of the first P-type base layer and a first part of the N-type base layer being between two of the plurality of first gate electrodes in the second direction;
a plurality of second gate electrodes provided on a second insulating film on the second side of the N-type base layer, the plurality of second gate electrodes being spaced from the plurality of first gate electrodes in the first direction, the plurality of second gate electrodes spaced from each other in the second direction, at least a portion of the second P-type base layer and a second part of the N-type base layer being between two of the plurality of second gate electrodes in the second direction;
a first electrode on the first side of the N-type base layer and electrically contacting the first P-type base layer; and
a second electrode on the second side of the N-type base layer and electrically contacting the second P-type base layer.

2. The device according to claim 1, wherein
the first P-type base layer and the first part of the N-type base layer are between each pair of first gate electrodes in the plurality of first gate electrodes,
the second P-type base layer and the second part of the N-type base layer are between each pair of second gate electrodes in the plurality of second gate electrodes, and
a distance between each pair of first gate electrodes in the plurality of first gate electrodes is 200 nm or less and a distance between each pair of second gate electrodes in the plurality of second gate electrodes is 200 nm or less.

3. The device according to claim 1, wherein a first N-type source region is selectively provided in the first P-type base layer, the first N-type source region being in direct contact with the first electrode.

4. The device according to claim 1, wherein a second N-type source region is selectively provided in the second P-type base layer, the second N-type source region being in direct contact with the second electrode.

5. The device according to claim 1, further comprising a third P-type base layer between the plurality of first gate electrodes and the plurality of second gate electrodes in the first direction, the third P-type base layer being adjacent to a third part of the N-type base layer in the second direction, the third part of the N-type base layer being between the first and second parts of the N-type base layer in the first direction.

6. The device according to claim 5, wherein an impurity concentration of the first part of the N-type base layer and an impurity concentration of the second part of the N-type base layer are each higher than an impurity concentration of the third part of the N-type base layer adjacent to the third P-type base layer.

7. The device according to claim 1, wherein the second direction is perpendicular to the first direction.

8. The device according to claim 1, wherein the plurality of first gate electrodes is aligned with the plurality of second gate electrodes in the first direction.

9. A semiconductor device comprising:
a semiconductor layer between a first electrode on a first side of the semiconductor layer and a second electrode on a second side of the semiconductor layer, the first and second sides being separated from each other in a first direction, the semiconductor layer including a P-type layer and a N-type layer adjacent to the P-type layer in a second direction crossing the first direction;
a plurality of first gate electrodes along the first side of the semiconductor layer, a first part of the P-type layer and a first part of the N-type layer being between the plurality of first gate electrodes in the second direction; and
a plurality of second gate electrodes along the second side of the semiconductor layer, a second part of the P-type layer and a second part of N-type layer being between the plurality of second gate electrodes in the second direction.

10. The device according to claim 9, wherein a distance between the plurality of first gate electrodes in the second direction is 200 nm or less and a distance between the plurality of second gate electrodes in the second direction is 200 nm or less.

11. The device according to claim 9, wherein
an N-type region is provided between the first part of the N-type layer and the second part of the N-type layer,
an impurity concentration of the N-type region is higher than an impurity concentration of the first part of the N-type layer and an impurity concentration of the second part of the N-type layer.

12. The device according to claim 9, wherein
a P-type region is provided between the first part of the P-type layer and the second part of the P-type layer,
an impurity concentration of the P-type region is higher than an impurity concentration of the first part of the P-type layer and an impurity concentration of the second part of the P-type layer.

13. The device according to claim 9, wherein
an impurity concentration of a first contact region in the N-type layer directly contacting the first electrode is higher than an impurity concentration of the first part of the N-type layer,
an impurity concentration of a second contact region in the N-type layer directly contacting the second electrode is higher than an impurity concentration of the second part of the N-type layer.

14. The device according to claim 9, wherein
an impurity concentration of a first contact region in the P-type layer directly contacting the first electrode is higher than an impurity concentration of the first part of the P-type layer,
an impurity concentration of a second contact region in the P-type layer directly contacting the second electrode is higher than an impurity concentration of the second part of the P-type layer.

15. The device according to claim 9, wherein the second direction is perpendicular to the first direction.

16. The device according to claim 9, wherein the plurality of first gate electrodes is aligned with the plurality of second gate electrodes in the first direction.

17. A semiconductor device, comprising:
a first semiconductor layer of a first conductivity type having an upper surface side and a lower surface side;
a second semiconductor layer of a second conductivity type on the upper surface side of the first semiconductor layer;
a third semiconductor layer of the second conductivity type on the lower surface side of the first semiconductor layer;
a first electrode directly contacting the second semiconductor layer, the second semiconductor layer being between the first electrode and the first semiconductor layer in a vertical direction;
a second electrode directly contacting the third semiconductor layer, the third semiconductor layer being between the second electrode and the first semiconductor layer in the vertical direction;
a plurality of first gate electrodes on the upper surface side of the first semiconductor layer, the second semiconductor layer being between adjacent pairs of first gate electrodes of the plurality of first gate electrodes in a horizontal direction, and a first part of the first semiconductor layer being between the adjacent pairs of first gate electrodes of the plurality of first gate electrodes in the horizontal direction and between the second electrode and the second semiconductor layer in the vertical direction; and
a plurality of second gate electrodes on the lower surface side of the first semiconductor layer, the plurality of second gate electrodes being spaced from the plurality of first gate electrodes in the vertical direction, the third semiconductor layer being between adjacent pairs of second gate electrodes of the plurality of second gate electrodes in the horizontal direction, and a second part of the first semiconductor layer being between the adjacent pairs of second gate electrodes of the plurality of second gate electrodes in the horizontal direction and between the first electrode and the third semiconductor layer in the vertical direction.

* * * * *